US 11,824,517 B2

(12) United States Patent
Kaajakari et al.

(10) Patent No.: US 11,824,517 B2
(45) Date of Patent: Nov. 21, 2023

(54) RESONATOR AND RESONANCE DEVICE

(71) Applicant: Murata Manufacturing Co., Ltd., Nagaokakyo (JP)

(72) Inventors: Ville Kaajakari, Helsinki (FI); Ryota Kawai, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/954,892

(22) Filed: Sep. 28, 2022

(65) Prior Publication Data
US 2023/0014350 A1    Jan. 19, 2023

Related U.S. Application Data

(63) Continuation of application No. PCT/JP2020/041997, filed on Nov. 11, 2020.

(30) Foreign Application Priority Data

Apr. 27, 2020  (JP) ................. 2020-078246

(51) Int. Cl.
*H03H 9/10*  (2006.01)
*H03H 9/05*  (2006.01)
*H03H 9/24*  (2006.01)

(52) U.S. Cl.
CPC ........ *H03H 9/1057* (2013.01); *H03H 9/0595* (2013.01); *H03H 9/2489* (2013.01)

(58) Field of Classification Search
CPC .. H03H 9/2489; H03H 9/0595; H03H 9/1057; H03H 2009/02511; B81B 3/00
See application file for complete search history.

(56) References Cited

U.S. PATENT DOCUMENTS

| 2018/0034441 | A1* | 2/2018 | Hirota ............... H03H 9/21 |
| 2018/0048286 | A1 | 2/2018 | Goto et al. |
| 2018/0212139 | A1 | 7/2018 | Hirota et al. |
| 2020/0144989 | A1 | 5/2020 | Kawai et al. |

FOREIGN PATENT DOCUMENTS

| WO | 2016174789 A1 | 11/2016 |
| WO | 2016175218 A1 | 11/2016 |
| WO | 2017064916 A1 | 4/2017 |
| WO | 2018216264 A1 | 11/2018 |

OTHER PUBLICATIONS

International Search Report in PCT/JP2020/041997, dated Dec. 22, 2020, 3 pages.

* cited by examiner

*Primary Examiner* — Jeffrey M Shin
(74) *Attorney, Agent, or Firm* — ArentFox Schiff LLP

(57) ABSTRACT

A resonator may include a vibrating portion that includes a plurality of vibrating arms to numbering in three or more, each having a fixed end, and including at least two vibrating arms to bend out of plane with different phases and a base portion having a fore end portion to which the fixed end of each of the plurality of vibrating arms to is connected and a rear end portion opposed to the fore end portion; a holding portion configured to hold the vibrating portion; and a support arm having one end connected to the holding portion and the other end connected to the rear end portion of the base portion. The support arm is asymmetric with respect to a center line of the vibrating portion with respect to a longitudinal direction in plan view.

20 Claims, 21 Drawing Sheets

RESONATOR AND RESONANCE DEVICE

CROSS REFERENCE TO RELATED APPLICATIONS

This application is a continuation of International Application No. PCT/JP2020/041997, filed Nov. 11, 2020, which claims priority to Japanese Patent Application No. 2020-078246, filed Apr. 27, 2020, the entire contents of each of which are hereby incorporated in their entirety.

TECHNICAL FIELD

The present disclosure is directed to a resonator and a resonance device in which a plurality of vibrating arms vibrate in an out-of-plane bending vibration mode.

BACKGROUND

Conventionally, a resonance device with use of micro electro mechanical systems (MEMS) technology has been used as a timing device, for example. This resonance device is mounted on a printed circuit board integrated in electronic equipment such as smartphone. The resonance device includes a lower-side substrate, an upper-side substrate to form a cavity between the upper-side substrate and the lower-side substrate, and a resonator placed in the cavity between the lower-side substrate and the upper-side substrate.

International Publication No. WO2016/175218 (the "'218 Publication") describes, for example, a resonator including a plurality of vibrating arms. This resonator includes a vibrating portion, a holding portion, and holding arms. The vibrating portion includes a base portion having a fore end and a rear end opposed to the fore end and the plurality of vibrating arms having fixed ends connected to the fore end of the base portion and extending in a direction away from the fore end. The holding portion is provided in at least a portion of a periphery of the vibrating portion. The holding arms are provided between the vibrating portion and the holding portion, each having one end connected to the base portion, and each having the other end connected to a region of the holding portion on a side of the fore end with respect to the rear end of the base portion. In the resonator of the '218 Publication, improvement in drive level dependency (which will be referred to as "DLD" hereinbelow) is pursued by placement of connection positions between the holding arms and the base portion with 60% or less of half of a base portion length.

SUMMARY OF INVENTION

In recent years, meanwhile, demands for miniaturization of resonators have been increasingly growing. As for resonators whose sizes have been limited with the miniaturization, it has been being made difficult to improve DLD only by a method of making a ratio of the connection positions for the holding arms to the length of the base portion length smaller than or equal to a specified ratio as in '218 Publication.

According to an aspect of the disclosure, the device has been produced in consideration of such circumstances and it is one of objects thereof to provide a resonator and a resonance device by which DLD can be further improved.

A resonator according to an aspect of the present disclosure includes a vibrating portion, a holding portion, and a support arm. The vibrating portion includes: a plurality of vibrating arms numbering in three or more, each having a fixed end, and including at least two vibrating arms to bend out of plane with different phases; and a base portion having one end to which the fixed end of each of the plurality of vibrating arms is connected and the other end opposed to the one end. The holding portion is configured to hold the vibrating portion. The support arm has one end connected to the holding portion and the other end connected to the other end of the base portion. The support arm is asymmetric with respect to a center line of the vibrating portion with respect to a longitudinal direction in plan view.

A resonator according to another aspect of the present disclosure includes a vibrating portion, a holding portion, and a support arm. The vibrating portion includes: a plurality of vibrating arms numbering in three or more, each having a fixed end, and including at least two vibrating arms to bend out of plane with different phases; and a base portion having one end to which the fixed end of each of the plurality of vibrating arms is connected, the other end opposed to the one end, and a side end. The holding portion is configured to hold the vibrating portion. The support arm has one end connected to the holding portion and the other end connected to the side end of the base portion. The support arm extends from one side to the other side with respect to a center line of the vibrating portion with respect to a longitudinal direction in plan view. The other end of the support arm is connected to the side end on the other side on the base portion.

A resonance device according to an aspect of the present disclosure includes the resonator described above.

According to the present disclosure, DLD can be further improved.

BRIEF DESCRIPTION OF DRAWINGS

In the descriptions that follow, like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings, wherein.

DETAILED DESCRIPTION

Figure 1:
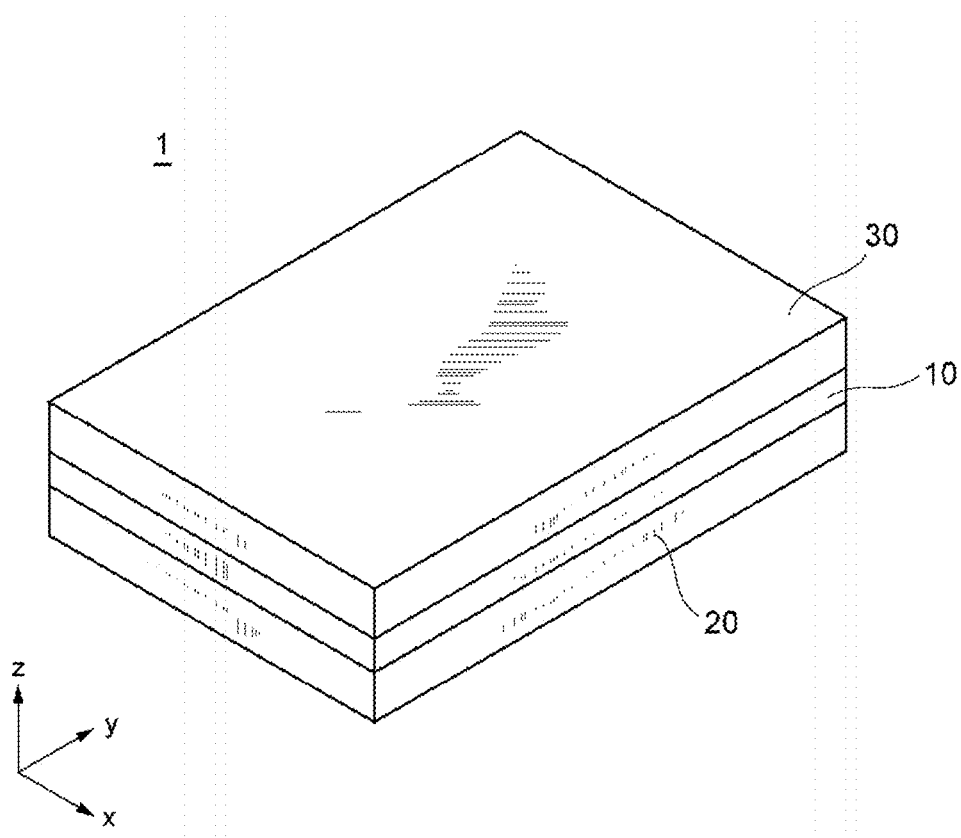
FIG. 1 is a perspective view generally illustrating an exterior of a resonance device in accordance with aspects of the present disclosure.

Hereinbelow, aspects of the present disclosure will be described. In a following description of the drawings, the same or similar components will be represented with use of the same or similar reference characters. The drawings are exemplary, sizes or shapes of portions are schematic, and technical scope of the present disclosure should not be understood with limitation to the aspects.

Figure 2:
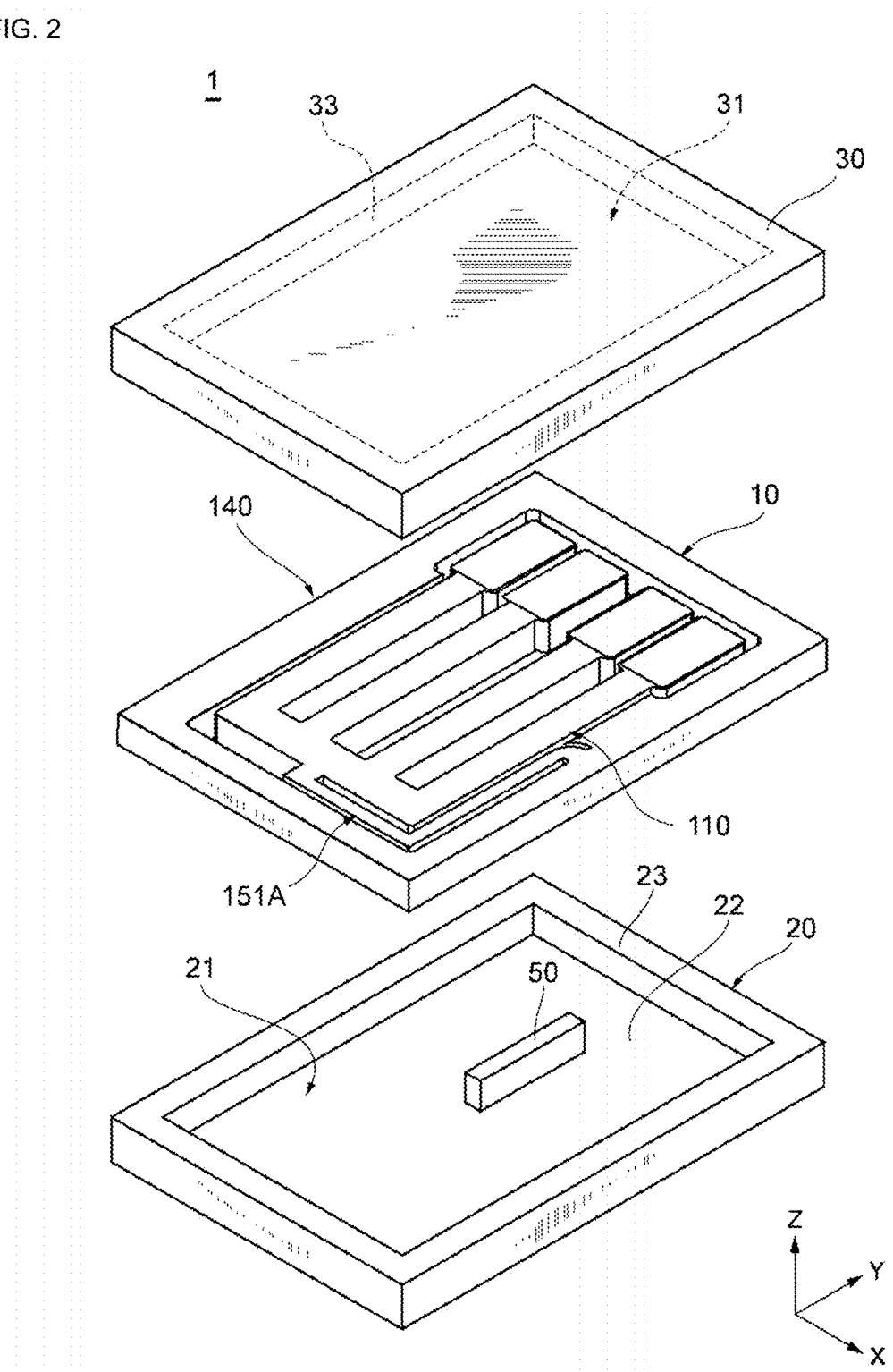
FIG. 2 is an exploded perspective view generally illustrating a structure of the resonance device illustrated in FIG. 1.

Initially, a general configuration of a resonance device according to an aspect of the present disclosure will be described with reference to FIGS. 1 and 2. FIG. 1 is a perspective view generally illustrating an exterior of a resonance device 1 in accordance with an aspect of the present disclosure. FIG. 2 is an exploded perspective view generally illustrating a structure of the resonance device 1 illustrated in FIG. 1.

The resonance device 1 includes a lower lid 20, a resonator 10, and an upper lid 30. That is, the resonance device 1 is configured by the lower lid 20, the resonator 10, and the upper lid 30 that are stacked in order of mention. The lower lid 20 and the upper lid 30 are placed so as to face each other with the resonator 10 interposed therebetween. Incidentally, the lower lid 20 and the upper lid 30 correspond to an example of "lid body" of the present disclosure.

Hereinbelow, configurations of the resonance device 1 will be described. Incidentally, the description below will be given with reference to a side of the resonance device 1 provided with the upper lid 30 as upper (or front) side and reference to a side of the resonance device 1 provided with the lower lid 20 as lower (or back) side.

The resonator 10 is a MEMS vibrator produced with use of MEMS technology. The resonator 10, the lower lid 20, and the upper lid 30 are jointed so that the resonator 10 is sealed and so that a vibration space for the resonator 10 is formed. Further, the resonator 10, the lower lid 20, and the upper lid 30 are each formed with use of a silicon (Si) substrate (which will be referred to as "Si substrate" below) and the Si substrates are jointed to one another. Incidentally, the resonator 10, the lower lid 20, and the upper lid 30 may be each formed with use of a silicon on insulator (SOI) substrate in which silicon layers and silicon oxide film are stacked.

The lower lid 20 includes a bottom plate 22 provided along XY plane and may be shaped like a rectangular flat plate and side walls 23 extending in Z axis direction, that is, a stacking direction for the lower lid 20 and the resonator 10 from a peripheral portion of the bottom plate 22. A recessed portion 21 defined by a front surface of the bottom plate 22 and inside surfaces of the side walls 23 is formed on a face of the lower lid 20 that faces the resonator 10. The recessed portion 21 forms at least a portion of the vibration space for the resonator 10. Incidentally, the lower lid 20 may lack the recessed portion 21 and may have a configuration like a flat plate. Further, a getter layer may be formed on a face of the recessed portion 21 of the lower lid 20 on a side of the resonator 10.

Further, the lower lid 20 includes a protruding portion 50 formed on the front surface of the bottom plate 22. A detailed configuration of the protruding portion 50 is described below.

The upper lid 30 includes a bottom plate 32 provided along XY plane and may be shaped like a rectangular flat plate and side walls 33 extending in Z axis direction from a peripheral portion of the bottom plate 32. A recessed portion 31 defined by a front surface of the bottom plate 32 and inside surfaces of the side walls 33 is formed on a face of the upper lid 30 that faces the resonator 10. The recessed portion 31 forms at least a portion of the vibration space that is a space in which the resonator 10 vibrates. Incidentally, the upper lid 30 may lack the recessed portion 31 and may have a configuration like a flat plate. Further, a getter layer may be formed on a face of the recessed portion 31 of the upper lid 30 on a side of the resonator 10.

By jointing of the upper lid 30, the resonator 10, and the lower lid 20, the vibration space for the resonator 10 is airtightly sealed so that a vacuum state is maintained. This vibration space may be filled with gas such as inert gas, for example.

Figure 3:
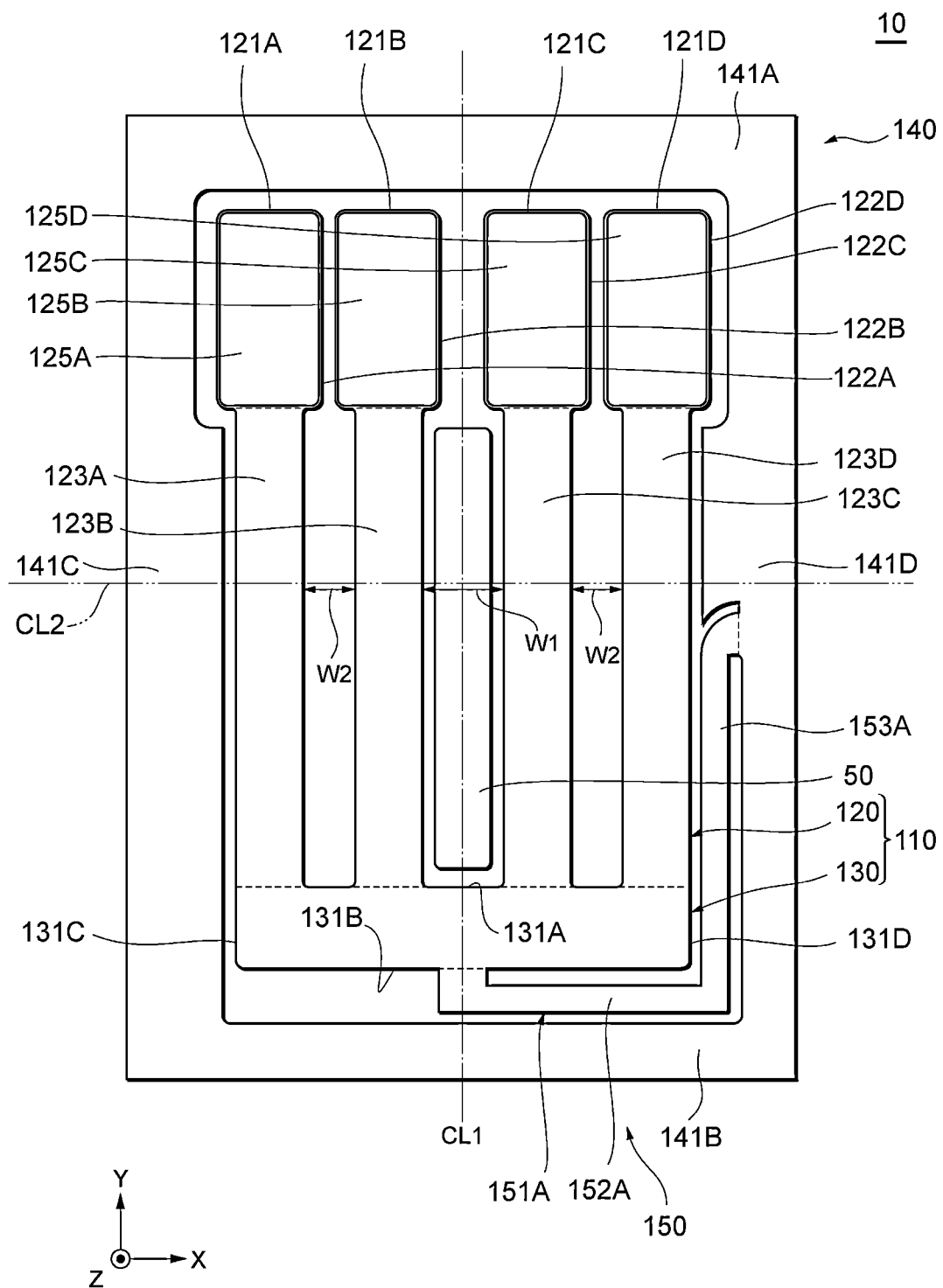
FIG. 3 is a plan view generally illustrating a structure of a resonator illustrated in FIG. 2.

Subsequently, a general configuration of the resonator according to further aspects will be described with reference to FIG. 3. FIG. 3 is a plan view generally illustrating a structure of the resonator 10 illustrated in FIG. 2.

As illustrated in FIG. 3, the resonator 10 is the MEMS vibrator produced with use of the MEMS technology and vibrates with an out-of-plane bending vibration mode as principal vibration (which may be referred to as "main mode" hereinbelow) in XY plane in an orthogonal coordinate system of FIG. 3.

The resonator 10 includes a vibrating portion 110, a holding portion 140, and a support arm portion 150.

The vibrating portion 110 has rectangular contours extending along XY plane in the orthogonal coordinate system of FIG. 3. The vibrating portion 110 is placed in an inner side portion of the holding portion 140 and a space is formed between the vibrating portion 110 and the holding portion 140 with specified intervals. In an example of FIG. 3, the vibrating portion 110 includes an excitation portion 120 made of four vibrating arms 121A to 121D (which may be collectively referred to as "vibrating arms 121" hereinbelow) and a base portion 130. Incidentally, the number of the vibrating arms is not limited to four and may be set at any desired number greater than or equal to three, for example. In accordance with one aspect of the disclosure, the excitation portion 120 and the base portion 130 are integrally formed.

The vibrating arms 121A, 121B, 121C, and 121D each extend along Y axis direction and are provided in parallel at specified intervals in X axis direction in order of mention. One end of the vibrating arm 121A is a fixed end connected to a fore end portion 131A of the base portion 130 that will be described below and the other end of the vibrating arm 121A is an open end provided far from the fore end portion 131A of the base portion 130. The vibrating arm 121A includes a mass addition portion 122A formed on a side of the open end and an arm portion 123A extending from the fixed end and connected to the mass addition portion 122A. Similarly, the vibrating arms 121B, 121C, and 121D respectively include mass addition portion 122B, 122C, and 122D and arm portions 123B, 123C, and 123D. Incidentally, the arm portions 123A to 123D each have a width on the order of 30 μm along X axis direction and a length on the order of 400 μm along Y axis direction, for example.

In the excitation portion 120, according to one aspect of the disclosure, the two vibrating arms 121A and 121D are placed in outer side portions and the two vibrating arms 121B and 121C are placed in an inner side portion with respect to X axis direction. A width (which will be referred to as "release width" hereinbelow) W1 of a gap formed between the arm portions 123B and 123C of the two vibrating arms 121B and 121C in the inner side portion is set greater than a release width W2 between the arm portions 123A and 123B of the vibrating arms 121A and 121B adjoining in X axis direction and then the release width W2 between the arm portions 123D and 123C of the vibrating arms 121D and 121C adjoining in X axis direction, for example. The release width W1 is on the order of 25 μm, for example, and the release width W2 is on the order of 10 μm, for example. Thus, vibration characteristics and durability of the vibrating portion 110 are improved by setting of the release width W1 greater than the release width W2. Incidentally, in order that the resonance device 1 may be miniaturized, the release width W1 may be set smaller than the release width W2 or the release width W1 and the release width W2 may be set so as to make equal intervals.

The mass addition portions 122A to 122D include mass addition films 125A to 125D on respective front surfaces. Therefore, weights per unit length (which may be simply referred to as "weights" hereinbelow) of the mass addition portions 122A to 122D are respectively heavier than weights of the arm portions 123A to 123D. Thus, the vibration characteristics can be improved while the vibrating portion 110 is miniaturized. Further, the mass addition films 125A to 125D may have a function of increasing weights of extremity portions of the vibrating arms 121A to 121D but also has a function, as so-called frequency regulation film, of regulating resonant frequencies of the vibrating arms 121A to 121D with scraping of portions thereof, respectively.

In accordance with one aspect of the disclosure, widths of the mass addition portions 122A to 122D along X axis direction are on the order of 49 μm, for example, and are greater than widths of the arm portions 123A to 123D along X axis direction, respectively. Thus, the weights of the mass addition portions 122A to 122D can be further increased. For miniaturization of the resonator 10, the widths of the mass addition portions 122A to 122D along X axis direction are preferably 1.5 or more times the widths of the arm portions 123A to 123D along X axis direction, respectively. It is sufficient, however, if the weights of the mass addition portions 122A to 122D are respectively heavier than the weights of the arm portions 123A to 123D and the widths of the mass addition portions 122A to 122D along X axis direction are not limited to the example of this aspect. The widths of the mass addition portions 122A to 122D along X axis direction may be smaller than or equal to the widths of the arm portions 123A to 123D along X axis direction, respectively.

In plan view of the resonator 10 from above (which will be simply referred to as "plan view" hereinbelow), the mass addition portions 122A to 122D each have a curved shape substantially shaped like a rectangle and rounded at four corners, such as so-called R shape. Similarly, the arm portions 123A to 123D are each substantially shaped like a rectangle and have the R shapes in vicinities of the fixed ends connected to the base portion 130 and in vicinities of connection portions connected to the mass addition portions 122A to 122D, respectively. The shapes of the mass addition portions 122A to 122D and the arm portions 123A to 123D, however, are not limited to the example of this aspect. For example, the shapes of the mass addition portions 122A to 122D may be substantially like trapezoids or letters L. Further, the shapes of the arm portions 123A to 123D may be substantially like trapezoids. A bottomed groove portion having an opening on either of a front surface side and a back surface side or a hole portion having openings on both of the front surface side and the back surface side may be formed on each of the mass addition portions 122A to 122D and the arm portions 123A to 123D. The groove portion and the hole portion may be separated from side surfaces linking the front surface and the back surface or may have an opening on a side of the side surface.

In plan view, the base portion 130 includes the fore end portion 131A, a rear end portion 131B, a left end portion 131C, and a right end portion 131D. As described above, the fixed ends of the vibrating arms 121A to 121D are connected to the fore end portion 131A. A support arm 151A of the support arm portion 150 that will be described below is connected to the rear end portion 131B.

Each of the fore end portion 131A, the rear end portion 131B, the left end portion 131C, and the right end portion 131D is a portion of an outer peripheral portion of the base portion 130. Specifically, the fore end portion 131A and the rear end portion 131B are end portions extending in X axis direction and are placed so as to be opposed to each other. The left end portion 131C and the right end portion 131D are end portions extending in Y axis direction and are placed so as to be opposed to each other. Both ends of the left end portion 131C are respectively linked to one end of the fore end portion 131A and to one end of the rear end portion 131B. Both ends of the right end portion 131D are respectively linked to the other end of the fore end portion 131A and to the other end of the rear end portion 131B.

In plan view, the base portion 130 may have a substantially rectangular shape having the fore end portion 131A and the rear end portion 131B as long sides and having the left end portion 131C and the right end portion 131D as short sides. The base portion 130 is formed substantially in plane symmetry with respect to an imaginary plane defined along a center line CL1 with respect to X axis direction that is a perpendicular bisector for the fore end portion 131A and the rear end portion 131B. That is, it can be said that the base portion 130 is formed substantially in line symmetry with respect to the center line CL1. Incidentally, the shape of the base portion 130 is not limited to a case of the rectangular shape illustrated in FIG. 3 and may be another shape configured substantially in line symmetry with respect to the center line CL1. For example, the shape of the base portion 130 may be like a trapezoid in which one of the fore end portion 131A and the rear end portion 131B is longer than the other. Further, at least one of the fore end portion 131A, the rear end portion 131B, the left end portion 131C, and the right end portion 131D may be bent or curved.

Incidentally, the imaginary plane corresponds to a symmetry plane for the vibrating portion 110 as a whole and the center line CL1 corresponds to a center line of the vibrating portion 110 as a whole with respect to X axis direction. Therefore, the center line CL1 is a line extending through a center of the vibrating arms 121A to 121D with respect to X axis direction and is located between the vibrating arm 121B and the vibrating arm 121C. Specifically, the adjoining vibrating arms 121A and 121B are respectively formed in symmetry to the adjoining vibrating arms 121D and 121C with respect to the center line CL1.

In the base portion 130, a base portion length that is the longest distance in Y axis direction between the fore end portion 131A and the rear end portion 131B is on the order of 20 μm, for example. Meanwhile, a base portion width that is the longest distance in X axis direction between the left end portion 131C and the right end portion 131D is on the order of 180 μm, for example. Incidentally, in the example illustrated in FIG. 3, the base portion length corresponds to a length of the left end portion 131C or the right end portion 131D and the base portion width corresponds to a length of the fore end portion 131A or the rear end portion 131B.

The holding portion 140 is configured so as to hold the vibrating portion 110. More particularly, the holding portion 140 is configured so that the vibrating arms 121A to 121D can vibrate. Specifically, the holding portion 140 is formed in plane symmetry with respect to the imaginary plane defined along the center line CL1. The holding portion 140 is shaped like a rectangular frame in plan view and is placed so as to surround an outer side portion of the vibrating portion 110 along XY plane. Thus, the holding portion 140 surrounding the vibrating portion 110 can be easily implemented by provision of the shape of the frame in plan view for the holding portion 140.

Incidentally, it is sufficient if the holding portion 140 is placed in at least a portion of a periphery of the vibrating portion 110 and there is no limitation to the shape of the frame. For example, it is sufficient if the holding portion 140 is placed in the periphery of the vibrating portion 110 to such an extent that the holding portion 140 can hold the vibrating portion 110 and can be jointed to the upper lid 30 and the lower lid 20.

In one aspect of the disclosure, the holding portion 140 includes frame bodies 141A to 141D formed integrally. As illustrated in FIG. 3, the frame body 141A is provided so as to face the open ends of the vibrating arms 121A to 121D and so as to have a longitudinal direction parallel to X axis.

The frame body 141B is provided so as to face the rear end portion 131B of the base portion 130 and so as to have a longitudinal direction parallel to X axis. The frame body 141C is provided so as to face the left end portion 131C of the base portion 130 and the vibrating arm 121A and so as to have a longitudinal direction parallel to Y axis and both ends thereof are respectively connected to one end of the frame bodies 141A and 141B. The frame body 141D is provided so as to face the right end portion 131D of the base portion 130 and the vibrating arm 121D and so as to have a longitudinal direction parallel to Y axis and both ends thereof are respectively connected to the other end of the frame bodies 141A and 141B. The frame bodies 141A and 141B face each other in Y axis direction with the vibrating portion 110 interposed therebetween. The frame bodies 141C and 141D face each other in X axis direction with the vibrating portion 110 interposed therebetween.

The support arm portion 150 is placed in the inner side portion of the holding portion 140 and makes a connection between the base portion 130 and the holding portion 140. The support arm portion 150 is formed so as not to be in line symmetry with respect to the center line CL1, that is, so as to be asymmetric. Specifically, the support arm portion 150 includes the one support arm 151A in plan view. The support arm 151A includes a support rear arm 152A and a support side arm 153A.

The support side arm 153A extends in parallel with the vibrating arm 121D between the vibrating arm 121D and the holding portion 140. Specifically, the support side arm 153A extends in Y axis direction from one end (right end or end on a side of the frame body 141D) of the support rear arm 152A toward the frame body 141A, is bent in X axis direction, and is connected to the frame body 141D. That is, one end of the support arm 151A is connected to the holding portion 140.

The support rear arm 152A extends from the support side arm 153A between the rear end portion 131B of the base portion 130 and the holding portion 140. Specifically, the support rear arm 152A extends in Y axis direction from one end (lower end or end on a side of the frame body 141B) of the support side arm 153A toward the frame body 141C. Further, the support rear arm 152A is bent in Y axis direction at a center of the base portion 130 with respect to X axis direction, extends therefrom along the center line CL1, and is connected to the rear end portion 131B of the base portion 130. That is, the other end of the support arm 151A is connected to the rear end portion 131B of the base portion 130.

The protruding portion 50 protrudes from the recessed portion 21 of the lower lid 20 into the vibration space. The protruding portion 50 is placed between the arm portion 123B of the vibrating arm 121B and the arm portion 123C of the vibrating arm 121C in plan view. The protruding portion 50 extends in Y axis direction in parallel with the arm portions 123B and 123C and is formed in a shape of a prism. The protruding portion 50 has a length on the order of 240 μm along Y axis direction and a length on the order of 15 μm along X axis direction. Incidentally, the number of the protruding portions 50 is not limited to one and may be two or more. By placement of the protruding portion 50 between the vibrating arm 121B and the vibrating arm 121C and protrusion thereof from the bottom plate 22 of the recessed portion 21, rigidity of the lower lid 20 can be increased and occurrence of flexure of the resonator 10 formed above the lower lid 20 or a warp of the lower lid 20 can be reduced.

Figure 4:
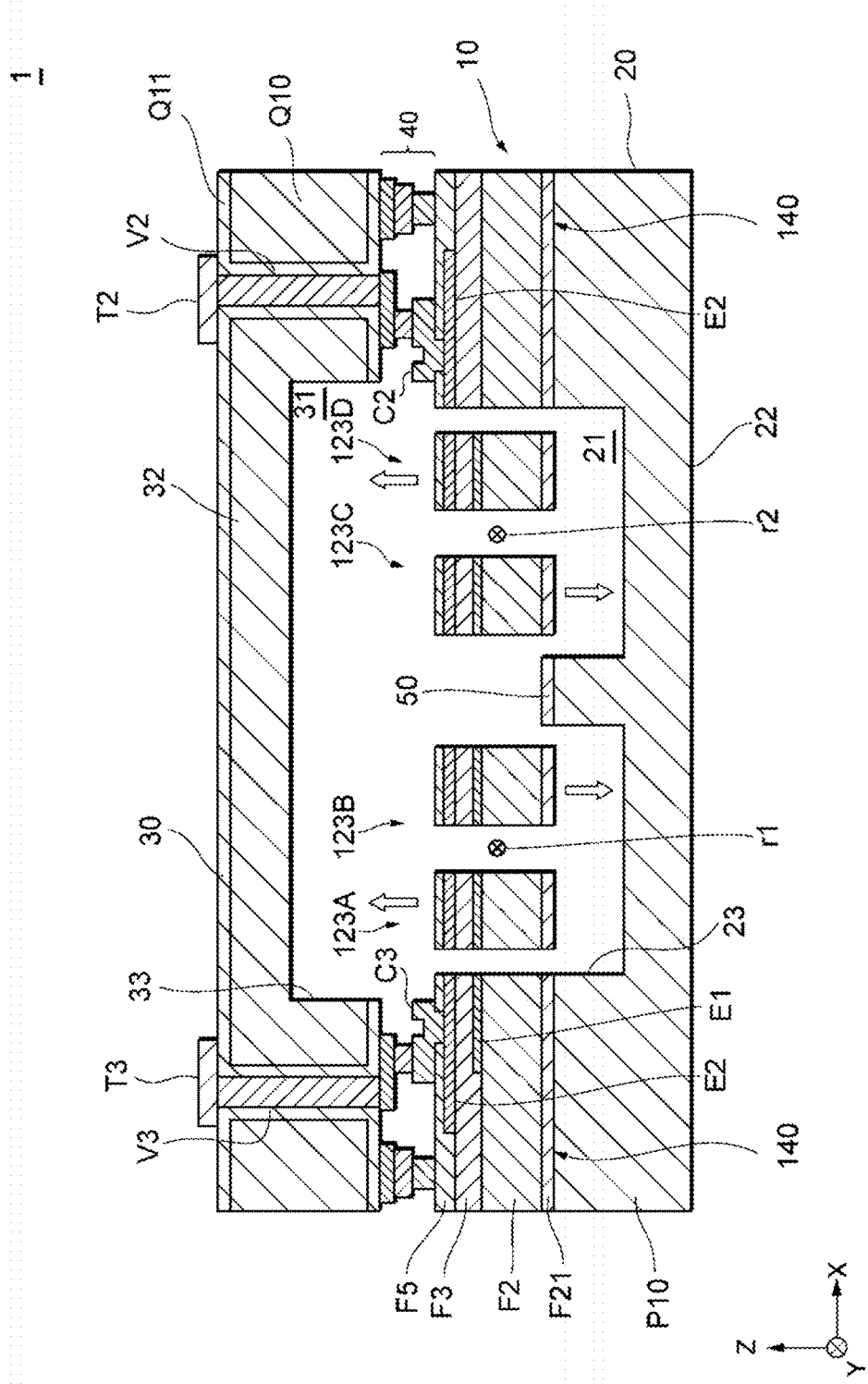
FIG. 4 is a sectional view, taken along X axis, generally illustrating a stacking structure of the resonance device illustrated in FIG. 1.
Figure 5:
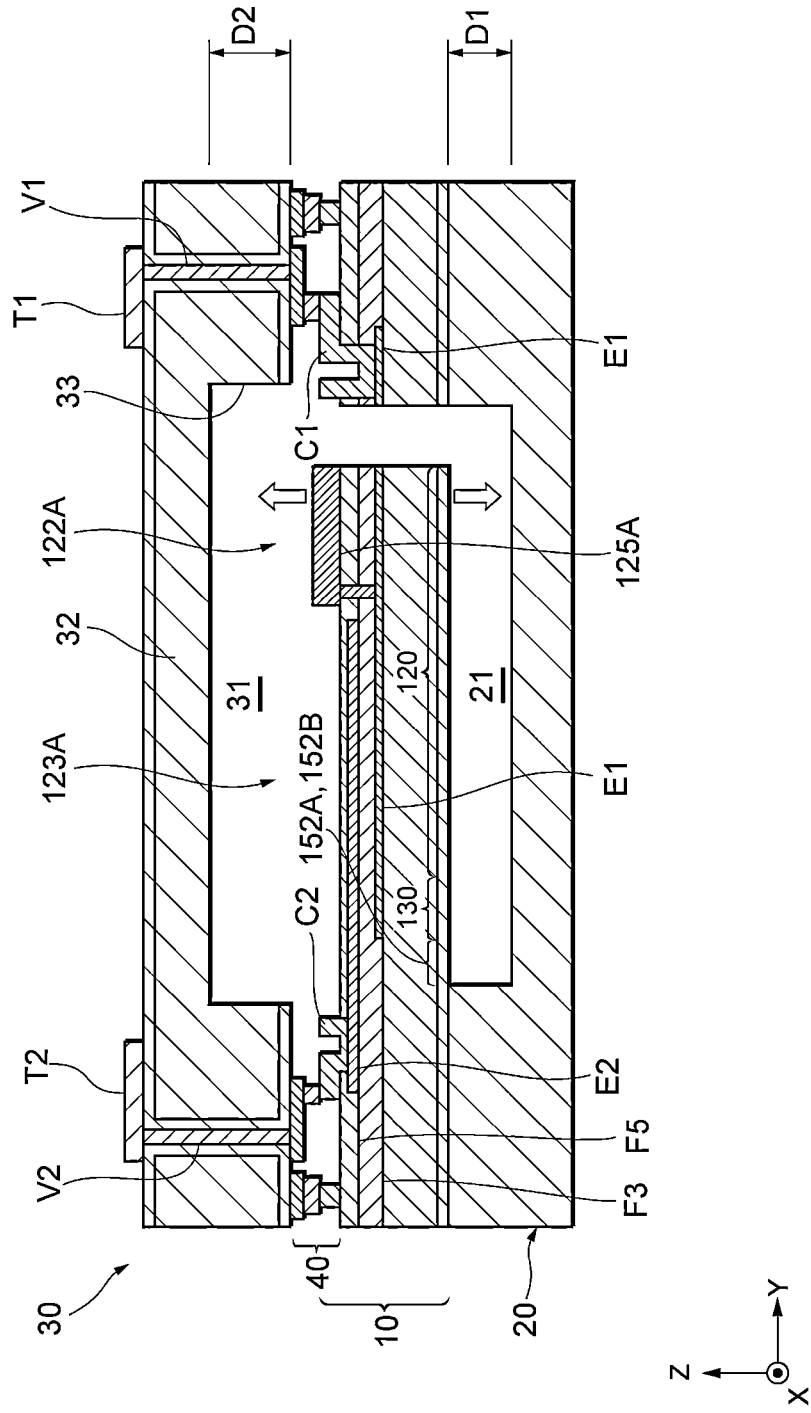
FIG. 5 is a sectional view, taken along Y axis, generally illustrating the stacking structure of the resonance device illustrated in FIG. 1.

Subsequently, a stacking structure and operation of the resonance device according to one aspect of the disclosure will be described with reference to FIGS. 4 and 5. FIG. 4 is a sectional view, taken along X axis, generally illustrating the stacking structure of the resonance device 1 illustrated in FIG. 1. FIG. 5 is a sectional view, taken along Y axis, generally illustrating the stacking structure of the resonance device 1 illustrated in FIG. 1.

In the resonance device 1, as illustrated in FIGS. 4 and 5, the holding portion 140 of the resonator 10 is jointed onto the side walls 23 of the lower lid 20 and then the holding portion 140 of the resonator 10 and the side walls 33 of the upper lid 30 are jointed. Thus, the resonator 10 is held between the lower lid 20 and the upper lid 30, so that the vibration space in which the vibrating portion 110 vibrates is formed by the lower lid 20, the upper lid 30, and the holding portion 140 of the resonator 10.

The vibrating portion 110, the holding portion 140, and the support arm portion 150 of the resonator 10 are integrally formed by an identical process. In the resonator 10, a metal film E1 is stacked on a Si substrate F2 that is an example of a substrate. Moreover, a piezoelectric film F3 is stacked on the metal film E1 so as to cover the metal film E1 and a metal film E2 is further stacked on the piezoelectric film F3. A protection film F5 is stacked on the metal film E2 so as to cover the metal film E2. In the mass addition portions 122A to 122D, furthermore, the aforementioned mass addition films 125A to 125D are each stacked on the protection film F5. Outer shapes of the vibrating portion 110, the holding portion 140, and the support arm portion 150 are formed by removal processing and patterning of a multilayer body composed of the aforementioned Si substrate F2, the metal film E1, the piezoelectric film F3, the metal film E2, the protection film F5, and the like through dry etching with irradiation with an argon (Ar) ion beam, for example.

Though the example in which the resonator 10 includes the metal film E1 has been disclosed in one aspect of the disclosure, there is no limitation thereto. In the resonator 10, for example, the Si substrate F2 itself can be made to double as the metal film E1 with use of a degenerate silicon substrate, resulting in low resistance, as the Si substrate F2, so that the metal film E1 may be omitted.

The Si substrate F2 is formed of degenerate n-type silicon (Si) semiconductor with a thickness on the order of 6 μm, for example, and may include phosphorus (P), arsenic (As), antimony (Sb), or the like as n-type dopant. Also, a resistance value of the degenerate silicon (Si) used for the Si substrate F2 is smaller than 1.6 mΩ.cm, for example, and is smaller than or equal to 1.2 mΩ.cm, more preferably. Further, a silicon oxide layer F21 made of Sift or the like, for example, is formed as an example of a temperature characteristics correction layer on a lower surface of the Si substrate F2. Thus, temperature characteristics can be improved.

In one aspect of the disclosure, the silicon oxide layer F21 refers to a layer having a function of reducing a temperature coefficient, that is, a changing rate per temperature of frequency in the vibrating portion 110 with the temperature correction layer formed on the Si substrate F2, at least in a vicinity of ordinary temperature, compared with a case where the silicon oxide layer F21 is not formed on the Si substrate F2. With the vibrating portion 110 having the silicon oxide layer F21, a change with temperature in a resonant frequency of a multilayer structure body made of the Si substrate F2, the metal films E1 and E2, the piezoelectric film F3, and the silicon oxide layer F21 can be reduced, for example. The silicon oxide layer may be formed on an upper surface of the Si substrate F2 or may be formed on both the upper surface of and the lower surface of the Si substrate F2.

It is desired that the silicon oxide layers F21 of the mass addition portions 122A to 122D may be formed with a uniform thickness. Incidentally, the uniform thickness means that a variation in the thicknesses of the silicon oxide layers F21 is within ±20% from an average value of the thicknesses.

The metal films E1 and E2 each includes an excitation electrode to excite the vibrating arms 121A to 121D and an extended electrode to make an electrical connection between the excitation electrode and an external power supply. Portions of the metal films E1 and E2 that function as the excitation electrodes face each other with the piezoelectric film F3 interposed therebetween in the arm portions 123A to 123D of the vibrating arms 121A to 121D. Portions of the metal films E1 and E2 that function as the extended electrodes extend through the support arm portion 150 and are derived from the base portion 130 to the holding portion 140, for example. The metal film E1 is electrically continuous throughout the resonator 10. The metal film E2 is electrically isolated between portions formed in the vibrating arms 121A and 121D and portions formed in the vibrating arms 121B and 121C.

Thicknesses of the metal films E1 and E2 are approximately 0.1 μm or more and 0.2 μm or less, for example. The metal films E1 and E2 are patterned into the excitation electrodes, the extended electrodes, and the like by removal processing such as etching after film formation. The metal films E1 and E2 are formed from metal material whose crystal structure is a body-centered cubic structure, for example. Specifically, the metal films E1 and E2 are formed with use of molybdenum (Mo), tungsten (W), or the like. Thus, the metal films E1 and E2 that are suitable for lower electrodes and upper electrodes of the resonator 10 can be easily implemented with use of metal whose crystal structure is the body-centered cubic structure, as a main component.

The piezoelectric film F3 is a thin film formed from a type of piezoelectric material that makes an interconversion between electric energy and mechanical energy. The piezoelectric film F3 expands and contracts in Y axis direction among in-plane directions in XY plane in accordance with an electric field formed in the piezoelectric film F3 by the metal films E1 and E2. With such expansion and contraction of the piezoelectric film F3, the vibrating arms 121A to 121D displace the open ends toward the bottom plate 22 of the lower lid 20 and the bottom plate 32 of the upper lid 30, respectively. Thus, the resonator 10 vibrates in the out-of-plane bending vibration mode.

Though a thickness of the piezoelectric film F3 is on the order of 1 μm, for example, the thickness may be on the order of 0.2 μm to 2 μm. The piezoelectric film F3 is formed from material having a crystal structure of wurtzite-type hexagonal crystal structure and may include nitride or oxide such as aluminum nitride (AlN), scandium aluminum nitride (ScAlN), zinc oxide (ZnO), gallium nitride (GaN), or indium nitride (InN), for example, as a main component. Incidentally, scandium aluminum nitride is made by substitution of scandium for a portion of aluminum in aluminum nitride and two elements such as magnesium (Mg) and niobium (Nb) or magnesium (Mg) and zirconium (Zr) may be substituted instead of scandium. Thus, the piezoelectric film F3 includes the piezoelectric material having the crystal structure of the wurtzite-type hexagonal crystal structure as the main component, so that the piezoelectric film F3 that is suitable for the resonator 10 can be easily implemented.

The protection film F5 protects the metal film E2 from oxidation. Incidentally, the protection film F5 does not have to be exposed to the bottom plate 32 of the upper lid 30 as long as the protection film F5 is provided on a side of the upper lid 30. For example, a parasitic capacitance reduction film to reduce capacitance of interconnections formed in the resonator 10 or the like may be formed so as to cover the protection film F5. The protection film F5 is formed of a piezoelectric film such as aluminum nitride (AlN), scandium aluminum nitride (ScAlN), zinc oxide (ZnO), gallium nitride (GaN), or indium nitride (InN) or an insulating film such as silicon nitride (SiN), silicon oxide ($SiO_2$), alumina oxide ($Al_2O_3$), or tantalum pentoxide ($Ta_2O_5$), for example. A thickness of the protection film F5, formed with a length that is smaller than or equal to half of the thickness of the piezoelectric film F3, is on the order of 0.2 μm, for example, in one aspect of the disclosure. Incidentally, a more preferable thickness of the protection film F5 is on the order of a quarter of the thickness of the piezoelectric film F3. Furthermore, in case where the protection film F5 is formed of piezoelectric material such as aluminum nitride (AlN), the piezoelectric material having the same orientation as the piezoelectric film F3 has is preferably used.

It is desired that the protection film F5 in the mass addition portions 122A to 122D may be formed with a uniform thickness. Incidentally, the uniform thickness means that a variation in the thicknesses of the protection film F5 is within ±20% from an average value of the thicknesses.

The mass addition films 125A to 125D configure surfaces of the mass addition portions 122A to 122D on a side of the upper lid 30 and correspond to the frequency regulation films of the vibrating arms 121A to 121D, respectively. A frequency of the resonator 10 is regulated with trimming processing in which a portion is removed from each of the mass addition films 125A to 125D. The mass addition films 125A to 125D are preferably formed from material having a mass reduction velocity with etching higher than the protection film F5 has, in terms of efficiency of frequency regulation. The mass reduction velocity is expressed by a product of etching velocity and density. The etching velocity is a thickness that is removed per unit time. Between the protection film F5 and the mass addition films 125A to 125D, magnitude relation of the etching velocity does not matter as long as relation of the mass reduction velocity is as described above. In addition, the mass addition films 125A to 125D are preferably formed from material having a large specific gravity in terms of efficient increase in weights of the mass addition portions 122A to 122D. For these reasons, the mass addition films 125A to 125D are formed from metal material such as molybdenum (Mo), tungsten (W), gold (Au), platinum (Pt), nickel (Ni), aluminum (Al), or titanium (Ti), for example.

Portions of upper surfaces of the mass addition films 125A to 125D have been removed with trimming processing in a step of regulating the frequency. The trimming processing for the mass addition films 125A to 125D can be carried out through the dry etching with irradiation with an argon (Ar) ion beam, for example. An ion beam is superior in processing efficiency because of capability of irradiation of a broad area, whereas there is a fear that the mass addition films 125A to 125D may be charged because the beam carries a charge. The mass addition films 125A to 125D are preferably grounded in order that the vibration characteristics of the resonator 10 may be prevented from being deteriorated with changes in vibratory tracks of the vibrating arms 121A to 121D that may be caused by a coulomb interaction with charging of the mass addition films 125A to 125D.

Extended lines C1, C2, and C3 are formed on the protection film F5 of the holding portion 140. The extended line C1 is electrically connected to the metal film E1 through a through-hole formed on the piezoelectric film F3 and the protection film F5. The extended line C2 is electrically connected to portions of the metal film E2, formed in the vibrating arms 121A and 121D, through through-holes formed on the protection film F5. The extended line C3 is electrically connected to portions of the metal film E2, formed in the vibrating arms 121B and 121C, through through-holes formed on the protection film F5. The extended lines C1 to C3 are formed from metal material such as aluminum (Al), germanium (Ge), gold (Au), or tin (Sn).

Though the example in which the arm portions 123A to 123D, the extended lines C2 and C3, penetrating electrodes V2 and V3, and the like are located on a cross-section on an identical plane is illustrated in FIG. 4 in one aspect of the disclosure, these are not necessarily located on a cross-section on an identical plane. For example, the penetrating electrodes V2 and V3 may be formed at positions that are apart in Y axis direction from a cross-section which is parallel to ZX plane defined by Z axis and X axis and which sections the arm portions 123A to 123D.

Similarly, though the example in which the mass addition portion 122A, the arm portion 123A, the extended lines C1 and C2, penetrating electrodes V1 and V2, and the like are located on a cross-section on an identical plane is illustrated in FIG. 5 in one aspect of the disclosure, these are not necessarily located on a cross-section on an identical plane.

The bottom plate 22 and the side walls 23 of the lower lid 20 are integrally formed as a Si substrate P10. The Si substrate P10 is formed of non-degenerate silicon having a resistivity greater than or equal to 10Ω.cm, for example. The Si substrate P10 is exposed in an inner side portion in the recessed portion 21 of the lower lid 20. The silicon oxide layer F21 is formed on an upper surface of the protruding portion 50. On the upper surface of the protruding portion 50, however, the Si substrate P10 having the lower electric resistivity than the silicon oxide layer F21 has may be exposed or a conductive layer may be formed in terms of reduction in charging in the protruding portion 50.

A thickness of the lower lid 20 defined in Z axis direction is on the order of 150 μm and a depth of the recessed portion 21 defined similarly is on the order of 50 μm.

The bottom plate 32 and the side walls 33 of the upper lid 30 are integrally formed as a Si substrate Q10. A front surface, a back surface, and inside surfaces of through-holes of the upper lid 30 are preferably covered with a silicon oxide film Q11. The silicon oxide film Q11 is formed on the surfaces of the Si substrate Q10 by oxidation of the Si substrate Q10 or chemical vapor deposition (CVD), for example. The Si substrate Q10 is exposed in an inner side portion in the recessed portion 31 of the upper lid 30. Incidentally, a getter layer may be formed on a surface of the recessed portion 31 of the upper lid 30 on a side facing the resonator 10. The getter layer is formed of titanium (Ti) or the like, for example, and absorbs outgas released from a joint portion 40 or the like that will be described below so as to reduce loss of vacuum in the vibration space. Incidentally, the getter layer may be formed on a surface of the recessed portion 21 of the lower lid 20 on a side facing the resonator 10 or may be formed on the surfaces of both the recessed portion 21 of the lower lid 20 and the recessed portion 31 of the upper lid 30 on the side facing the resonator 10.

A thickness of the upper lid 30 defined in Z axis direction is on the order of 150 μm and a depth of the recessed portion 31 defined similarly is on the order of 50 μm.

Terminals T1, T2, and T3 are formed on an upper surface (surface on a side opposed to the surface facing the resonator 10) of the upper lid 30. The terminal T1 is a mounting terminal to ground the metal film E1. The terminal T2 is a mounting terminal to electrically connect the metal film E2 of the vibrating arms 121A and 121D to the external power supply. The terminal T3 is a mounting terminal to electrically connect the metal film E2 of the vibrating arms 121B and 121C to the external power supply. The terminals T1 to T3 are each formed of a metallization layer (foundation layer) of chromium (Cr), tungsten (W), nickel (Ni), or the like plated with nickel (Ni), gold (Au), silver (Ag), copper (Cu), or the like, for example. Incidentally, a dummy terminal electrically insulated from the resonator 10 may be formed on the upper surface of the upper lid 30, for a purpose of regulating a parasitic capacitance or a mechanical strength balance.

The penetrating electrodes V1, V2, and V3 are formed in the side walls 33 of the upper lid 30. The penetrating electrode V1 makes an electrical connection between the terminal T1 and the extended line C1, the penetrating electrode V2 makes an electrical connection between the terminal T2 and the extended line C2, and the penetrating electrode V3 makes an electrical connection between the terminal T3 and the extended line C3. The penetrating electrodes V1 to V3 are formed by filling with conductive material in the through-holes penetrating the side walls 33 of the upper lid 30 in Z axis direction. The conductive material for the filling is polycrystalline silicon (Poly-Si), copper (Cu), gold (Au), or the like, for example.

The joint portion 40 is formed between the side walls 33 of the upper lid 30 and the holding portion 140 and the upper lid 30 is jointed to the resonator 10 by the joint portion 40. The joint portion 40 is formed in a shape of a closed loop surrounding the vibrating portion 110 in XY plane, so as to airtightly seal the vibration space for the resonator 10 in the vacuum state. The joint portion 40 is formed of a metal film in which aluminum (Al) film, germanium (Ge) film, and aluminum (Al) film are stacked in order of mention and are eutectically bonded, for example. Incidentally, the joint portion 40 may be formed of a combination of film selected appropriately from gold (Au), tin (Sn), copper (Cu), titanium (Ti), silicon (Si), and the like. Further, the joint portion 40 may include a metal compound such as titanium nitride (TiN), tantalum nitride (TaN), or the like between the films, for improvement in close contact property.

In one aspect of the disclosure, the terminal T1 is grounded and alternating voltages opposed in phase to each other are applied to the terminals T2 and T3. Therefore, phases of an electric field formed in the piezoelectric film F3 of the vibrating arms 121A and 121D and phases of an electric field formed in the piezoelectric film F3 of the vibrating arms 121B and 121C are opposed to each other. Thus, the vibrating arms 121A and 121D in the outer side portions and the vibrating arms 121B and 121C in the inner side portion are displaced in directions opposed to each other.

When the mass addition portions 122A, 122D and the arm portions 123A, 123D of the vibrating arms 121A, 121D are displaced toward an inside surface of the upper lid 30 as illustrated in FIG. 4, for example, the mass addition portions 122B, 122C and the arm portions 123B, 123C of the vibrating arms 121B, 121C are displaced toward an inside surface of the lower lid 20. When the mass addition portions 122A, 122D and the arm portions 123A, 123D of the vibrating arms 121A, 121D are inversely displaced toward the inside surface of the lower lid 20, though illustration is omitted, the mass addition portions 122B, 122C and the arm portions 123B, 123C of the vibrating arms 121B, 121C are displaced toward the inside surface of the upper lid 30. Accordingly, at least two of the four vibrating arms 121A to 121D bend out of plane with different phases.

In relation between the adjoining vibrating arms 121A and 121B, in this manner, the vibrating arm 121A and the vibrating arm 121B vibrate upward and downward in opposite directions around a center axis r1 extending in Y axis direction. In relation between the adjoining vibrating arms 121C and 121D, meanwhile, the vibrating arm 121C and the vibrating arm 121D vibrate upward and downward in opposite directions around a center axis r2 extending in Y axis direction. Consequently, torsional moments in opposite directions are caused for the center axis r1 and the center axis r2, so that bending vibrations in the vibrating portion 110 are produced. Maximum amplitudes of the vibrating arms 121A to 121D are on the order of 50 μm and amplitudes thereof at time of normal driving are on the order of 10 μm.

Figure 6:
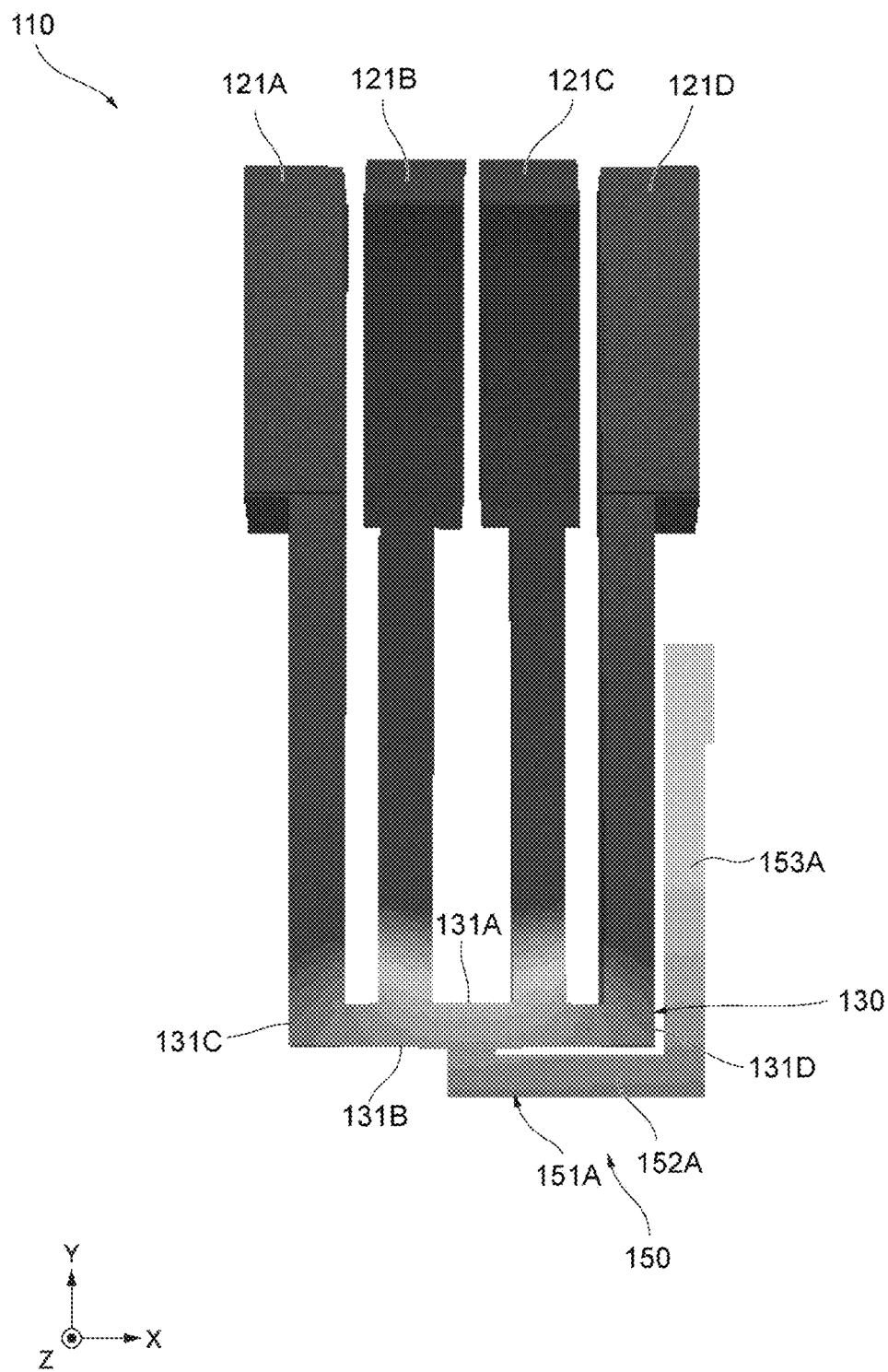
FIG. 6 is a plan view schematically illustrating a displacement distribution based on vibrations of a vibrating portion illustrated in FIG. 3.
Figure 7:
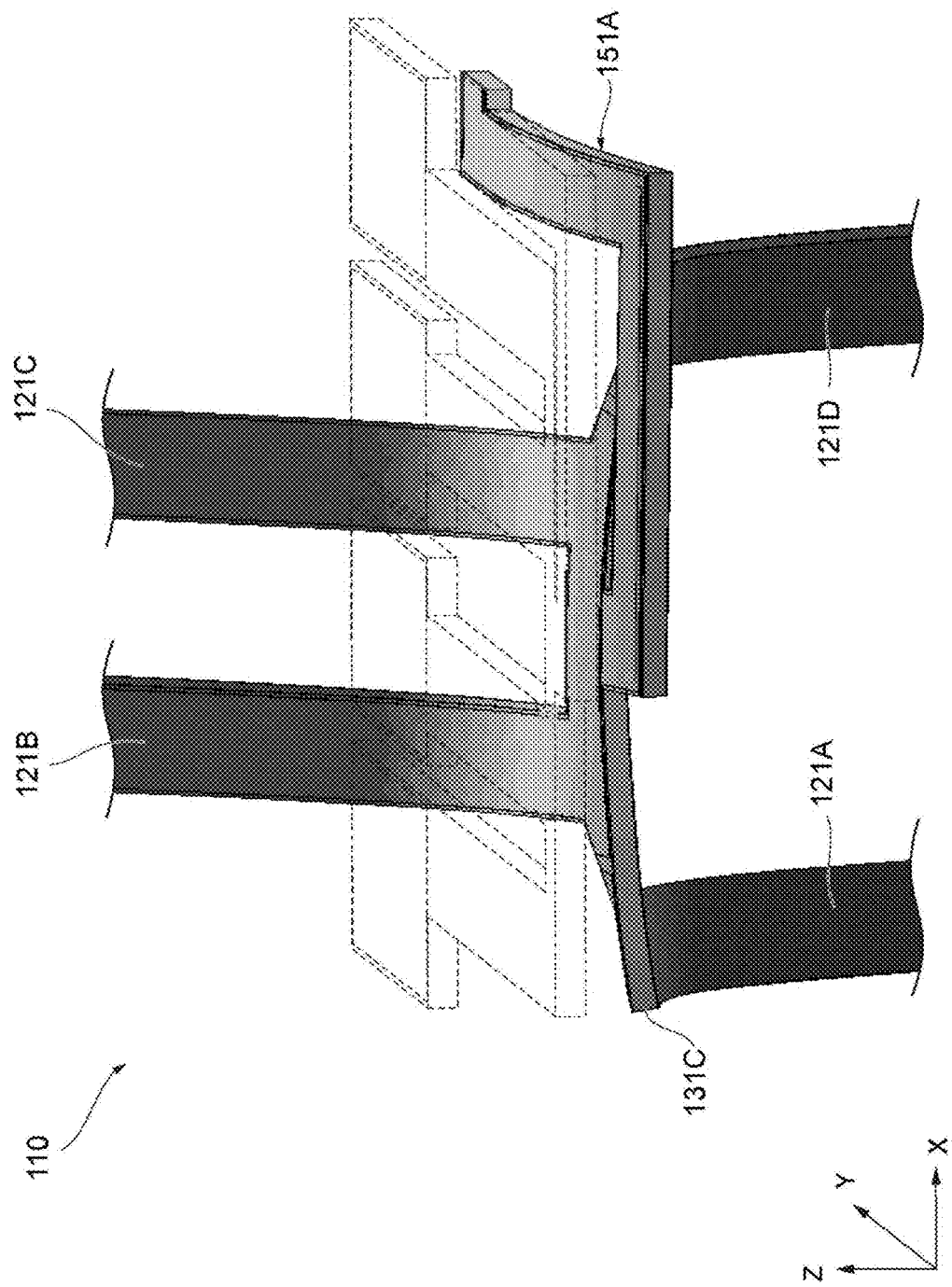
FIG. 7 is a perspective view schematically illustrating the displacement distribution based on the vibrations of the vibrating portion illustrated in FIG. 3.

Subsequently, displacement due to the vibrations of the vibrating portion will be described with reference to FIGS. 6 and 7. FIG. 6 is a plan view schematically illustrating a displacement distribution based on the vibrations of the vibrating portion 110 illustrated in FIG. 3. FIG. 7 is a perspective view schematically illustrating the displacement distribution based on the vibrations of the vibrating portion 110 illustrated in FIG. 3. Incidentally, in the vibrating portion 110 illustrated in FIGS. 6 and 7, areas with dark colors indicate that amounts of the displacement are large and areas with light colors indicate that the amounts of the displacement are small.

As illustrated in FIGS. 6 and 7, the vibrating portion 110 vibrates in the out-of-plane bending vibration mode and thus the displacement of the vibrating arms 121A to 121D is increased. With the displacement of the vibrating arms 121A to 121D, the base portion 130 held by the holding portion 140 through the support arm portion 150 is also displaced with flexure. In one aspect of the disclosure, the one support arm 151A, making the connection between the holding portion 140 and the base portion 130, is asymmetric with respect to the center line CL1 in plan view and thus the flexure of the base portion 130 is increased compared with conventional configurations so that displacement thereof, more particularly, displacement of the left end portion 131C and the right end portion 131D of the base portion 130 is increased.

Figure 8:
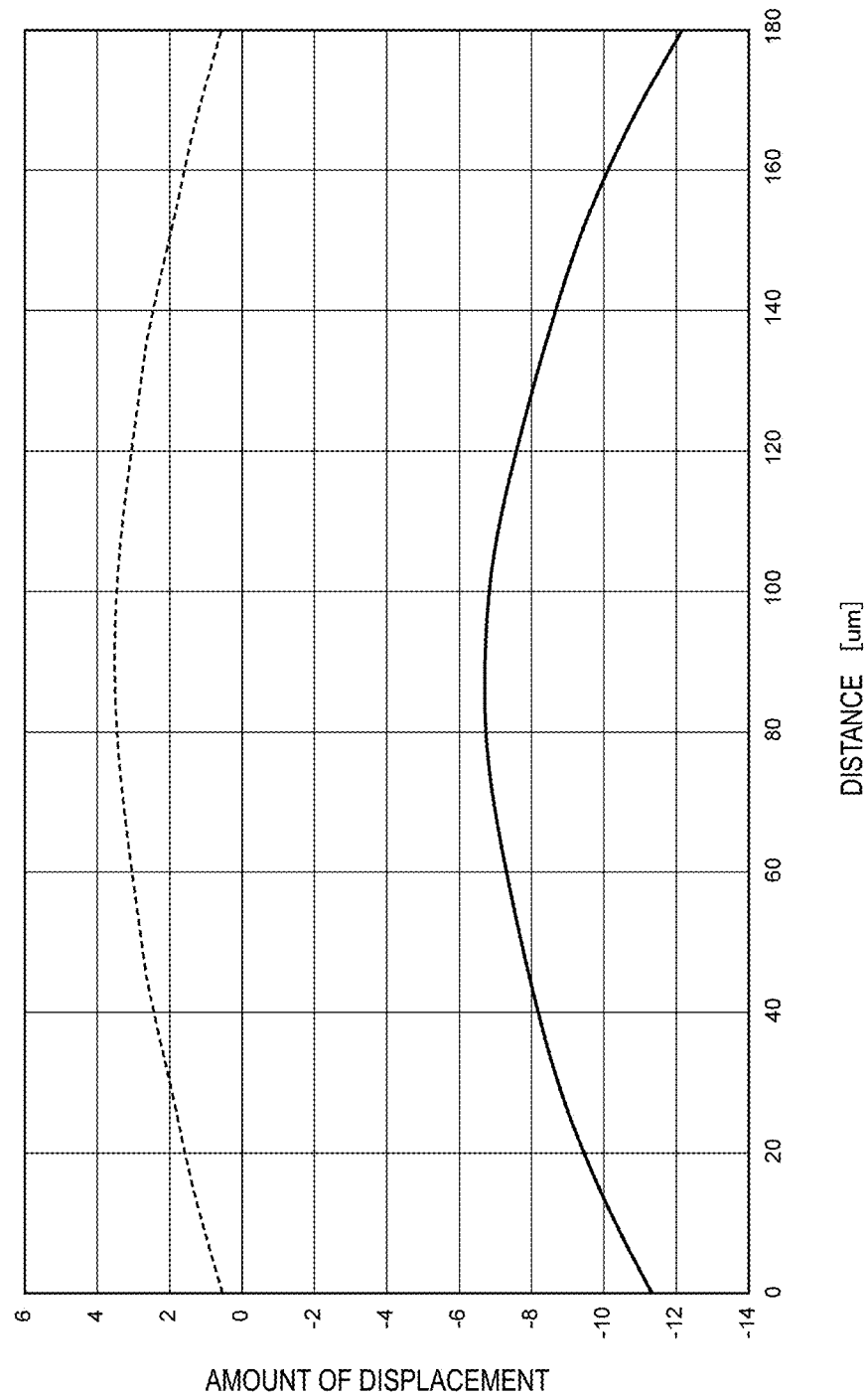
FIG. 8 is a graph illustrating amounts of displacement of a base portion due to the vibrations of the vibrating portion illustrated in FIG. 3.

Herein, amounts of displacement of the base portion due to the vibrations of the vibrating portion will be described with reference to FIG. 8. FIG. 8 is a graph illustrating the amounts of displacement of the base portion 130 due to the vibrations of the vibrating portion 110 illustrated in FIG. 3. In FIG. 8, a horizontal axis represents a distance defined with the left end portion 131C of the base portion 130 set as a reference, that is, zero and a vertical axis represents a relative value of the amounts of displacement. In FIG. 8, incidentally, the amounts of displacement in the resonator 10 of one aspect of the disclosure are denoted by a solid line and the amounts of displacement in a conventional resonator are denoted by a dotted line, for comparison. The conventional resonator is similar to the resonator 10 in structures, except that two support arms are formed so as to be symmetrical or substantially symmetrical with respect to a center line of a vibrating portion with respect to X axis direction.

In the conventional resonator, as illustrated by the dotted line in FIG. 8, the amount of displacement of the base portion is minimized in vicinities of both side end portions of the base portion and is maximized in a vicinity of a center portion of the base portion.

In the resonator 10 of one aspect of the disclosure, as illustrated by the solid line in FIG. 8 by contrast, the amount of displacement of the base portion 130 is minimized in a vicinity of a center portion of the base portion 130 and is maximized in vicinities of both the side end portions of the base portion 130, that is, the left end portion 131C and the right end portion 131D. Further, the amounts of displacement in the left end portion 131C and the right end portion 131D are larger in absolute value than the amounts of displacement in the vicinity of the center portion of the base portion of the conventional resonator. Thus, it is observed that the amounts of displacement of the base portion 130 in the resonator 10 of one aspect of the disclosure are greater compared with the conventional resonator.

Thus, the support arm 151A increases the flexure of the base portion 130 because being asymmetric with respect to the center line CL1 of the vibrating portion 110 with respect to the longitudinal direction in plan view, compared with the conventional configuration being symmetrical or substantially symmetrical with respect to the center line of the vibrating portion with respect to a longitudinal direction, so that a frequency changing rate in the resonant frequency per unit power that is an index of DLD and that will be described below can be changed in a negative direction. Accordingly, the frequency changing rate in the resonant frequency per unit power can be lowered and DLD can be further improved.

Though the example in which the support arm 151A is connected to a center position on the rear end portion 131B of the base portion 130 in the resonator 10 illustrated in FIG. 3 has been disclosed in one aspect of the disclosure, there is no limitation to this example. The support arm 151A may be connected to another position on the rear end portion 131B of the base portion 130 as long as the support arm 151A is asymmetric with respect to the center line CL1 in plan view.

Figure 9:
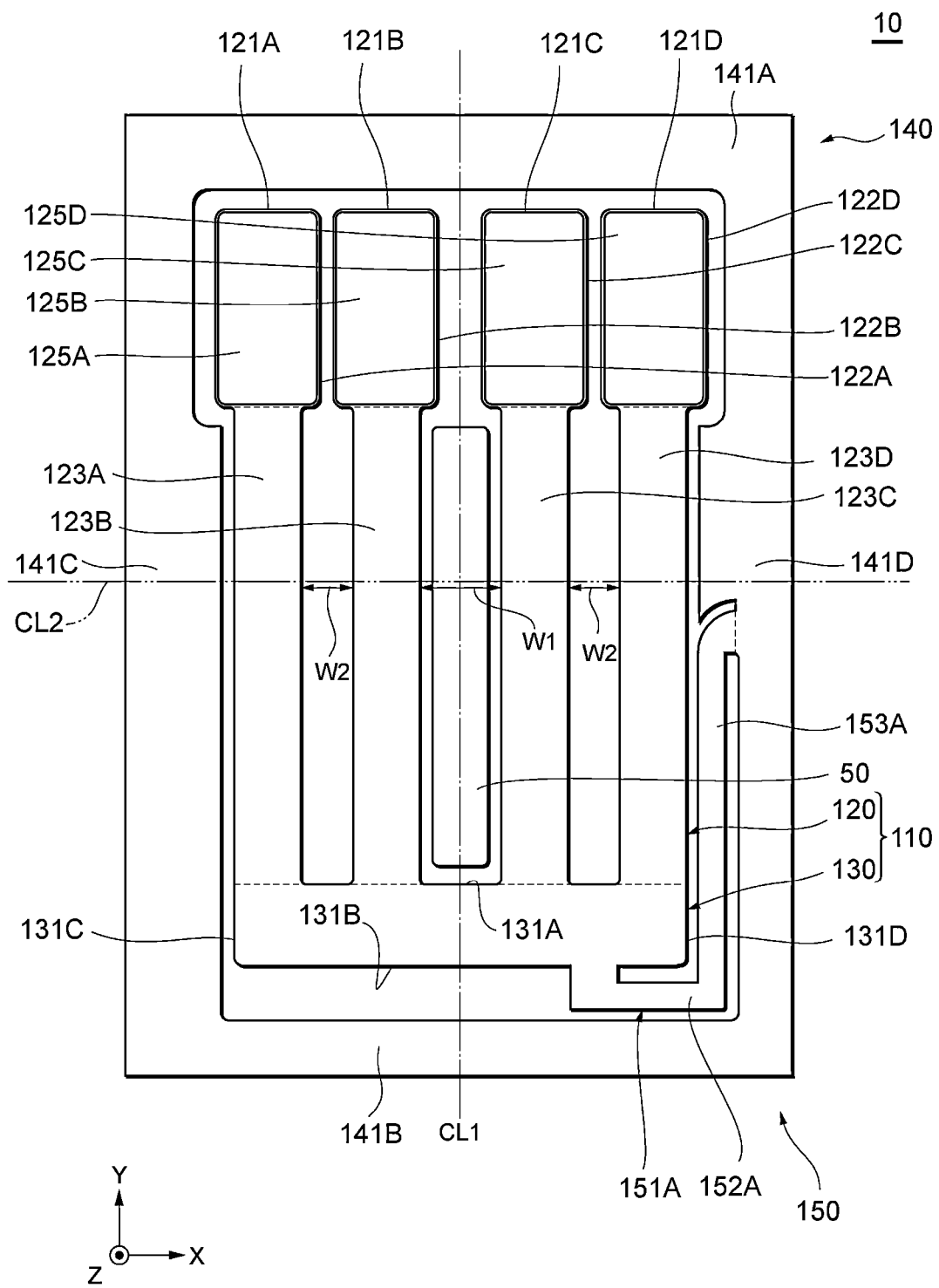
FIG. 9 is a plan view generally illustrating a structure of a resonator in a first modification in accordance with aspects of the present disclosure.
Figure 10:
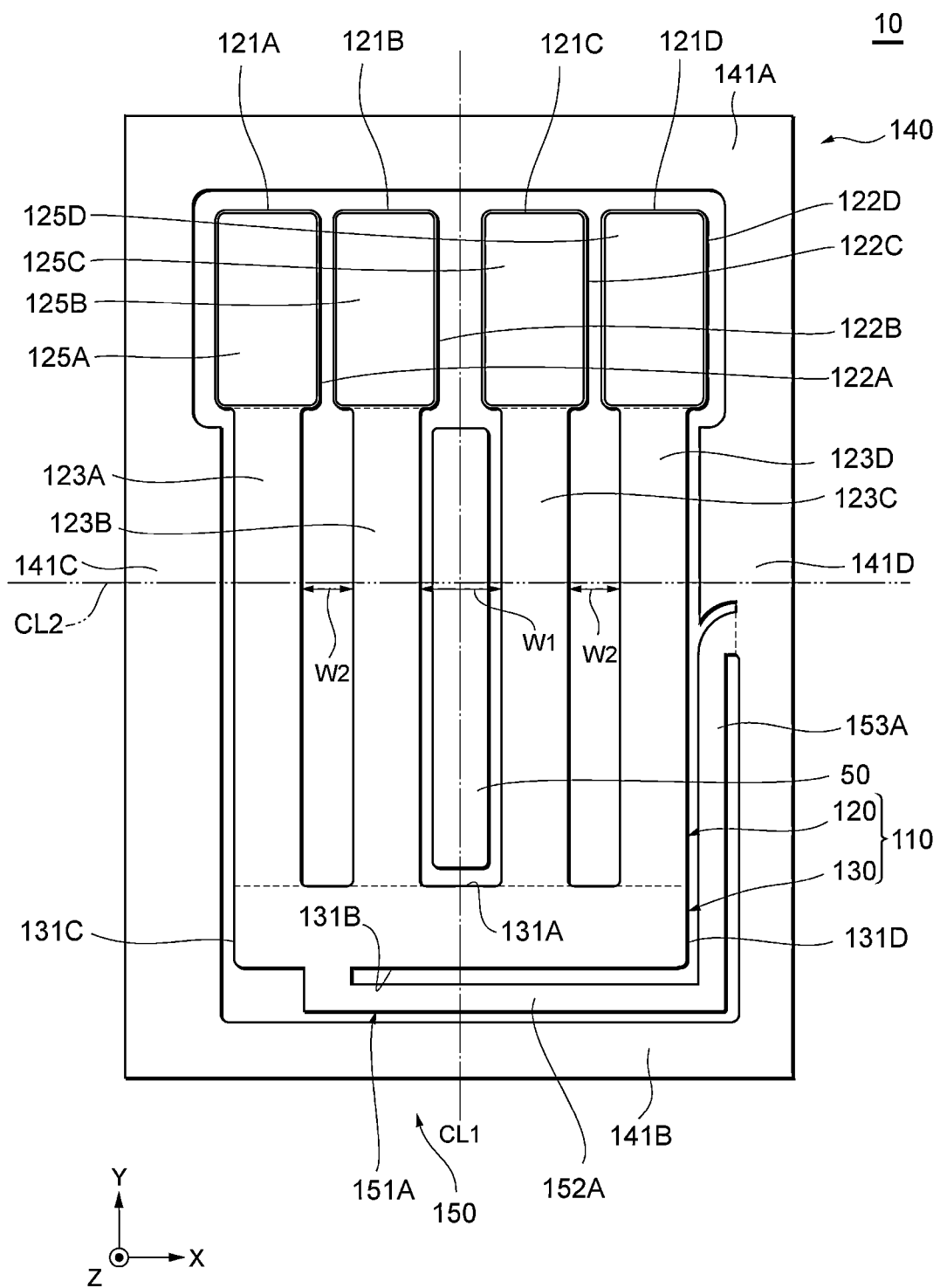
FIG. 10 is a plan view generally illustrating a structure of a resonator in a second modification in accordance with aspects of the present disclosure.

Subsequently, modifications of the resonator according to one aspect of the disclosure will be described with reference to FIGS. 9 and 10. FIG. 9 is a plan view generally illustrating a structure of the resonator 10 in a first modification of one aspect of the disclosure. FIG. 10 is a plan view generally illustrating a structure of the resonator 10 in a second modification of one aspect of the disclosure.

In the resonator 10 of the first modification, as illustrated in FIG. 9, the support arm 151A is connected to a position on the rear end portion 131B of the base portion 130 that is deviated from the center line CL1. Specifically, the other end of the support arm 151A is connected to one side (positive side in X axis direction or side of the right end portion 131D) on the rear end portion 131B of the base portion 130 with respect to the center line CL1.

Meanwhile, in the resonator 10 of the second modification, as illustrated in FIG. 10, the support arm 151A is connected to a position on the rear end portion 131B of the base portion 130 that is deviated from the center line CL1. More particularly, the support arm 151A extends from one side (positive side in X axis direction or side of the right end portion 131D) to the other side (negative side in X axis direction or side of the left end portion 131C) with respect to the center line CL1. In addition, the other end of the support arm 151A is connected to the other side (negative side in X axis direction or side of the left end portion 131C) on the rear end portion 131B of the base portion 130 with respect to the center line CL1.

Figure 11:
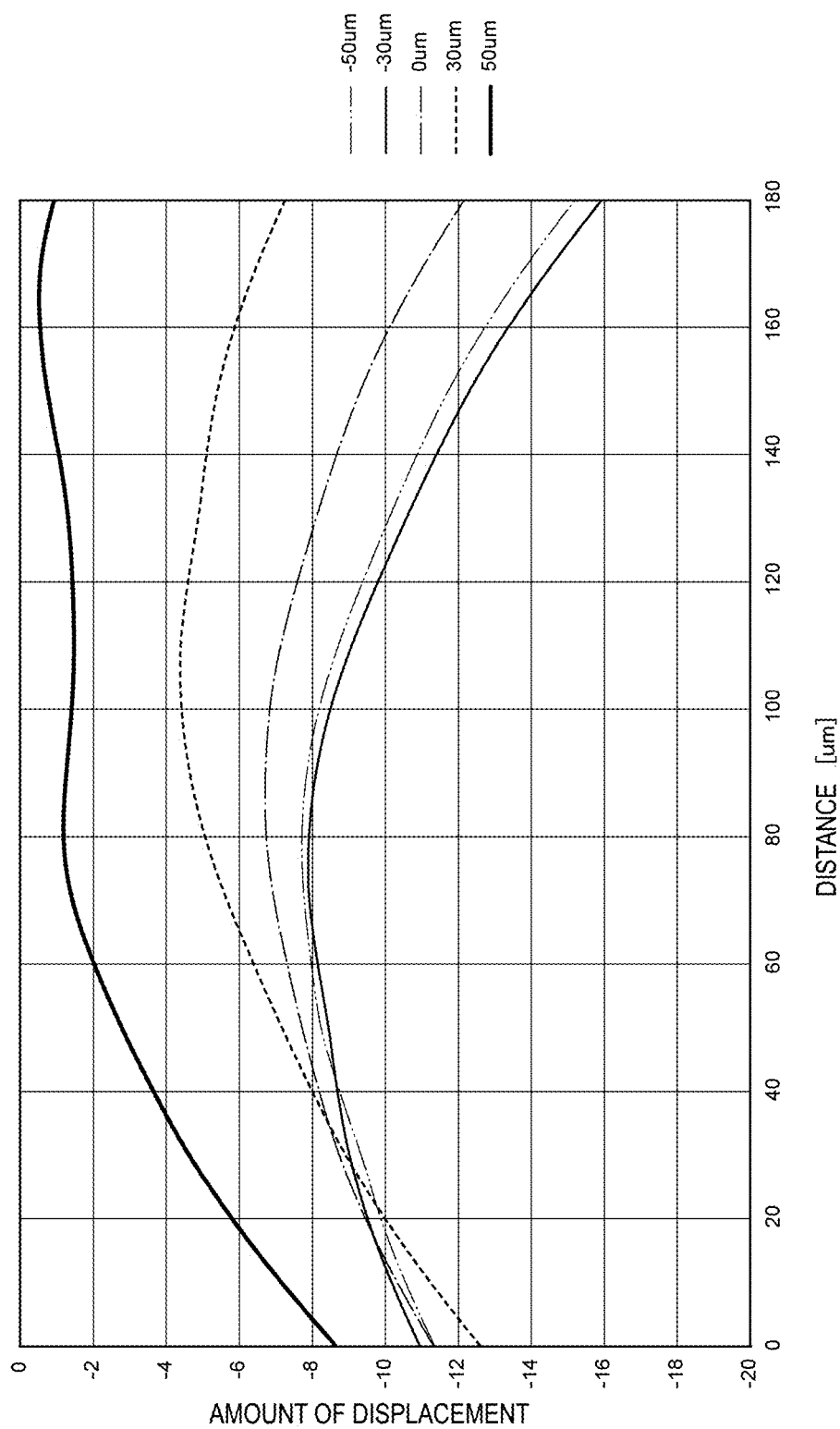
FIG. 11 is a graph illustrating amounts of displacement of a base portion due to vibrations of a vibrating portion illustrated in FIGS. 9 and 10.

Herein, amounts of displacement of the base portion due to the vibrations of the vibrating portion will be described with reference to FIG. 11. FIG. 11 is a graph illustrating the amounts of displacement of the base portion 130 due to vibrations of the vibrating portion 110 illustrated in FIGS. 9 and 10. In FIG. 11, a horizontal axis represents a distance defined with the left end portion 131C of the base portion 130 set as a reference, that is, zero and a vertical axis represents a relative value of the amounts of displacement. Further, lines in FIG. 11 denote the amounts of displacement of the base portion 130 on conditions that the other end of the support arm 151A is connected to positions of −50 µm, −30 µm, 30 µm, and 50 µm on the rear end portion 131B of the base portion 130, which are defined relative to a position of zero on the rear end portion 131B of the base portion 130 where the center line CL1 passes, with one side (right side) of the center line CL1 defined as positive and with the other side (left side) of the center line CL1 defined as negative. In FIG. 11, incidentally, the amounts of displacement of the base portion 130 due to the vibrations of the vibrating portion 110 illustrated in FIG. 3 are denoted as a line on condition that the other end of the support arm 151A is connected to the position on the rear end portion 131B of the base portion 130 where the center line CL1 passes, that is, the position of 0 µm.

As illustrated in FIG. 11, the amounts of displacement of the base portion 130 are larger in absolute value than the amounts of displacement of the base portion of the conventional resonator, in regard to all the connection positions. Further, it is observed that the amounts of displacement of the base portion 130 tend to be greater in case where the other end of the support arm 151A is connected to a negative position, that is, a position on the other side with respect to the center line CL1, on the rear end portion 131B of the base portion 130.

Figure 12:
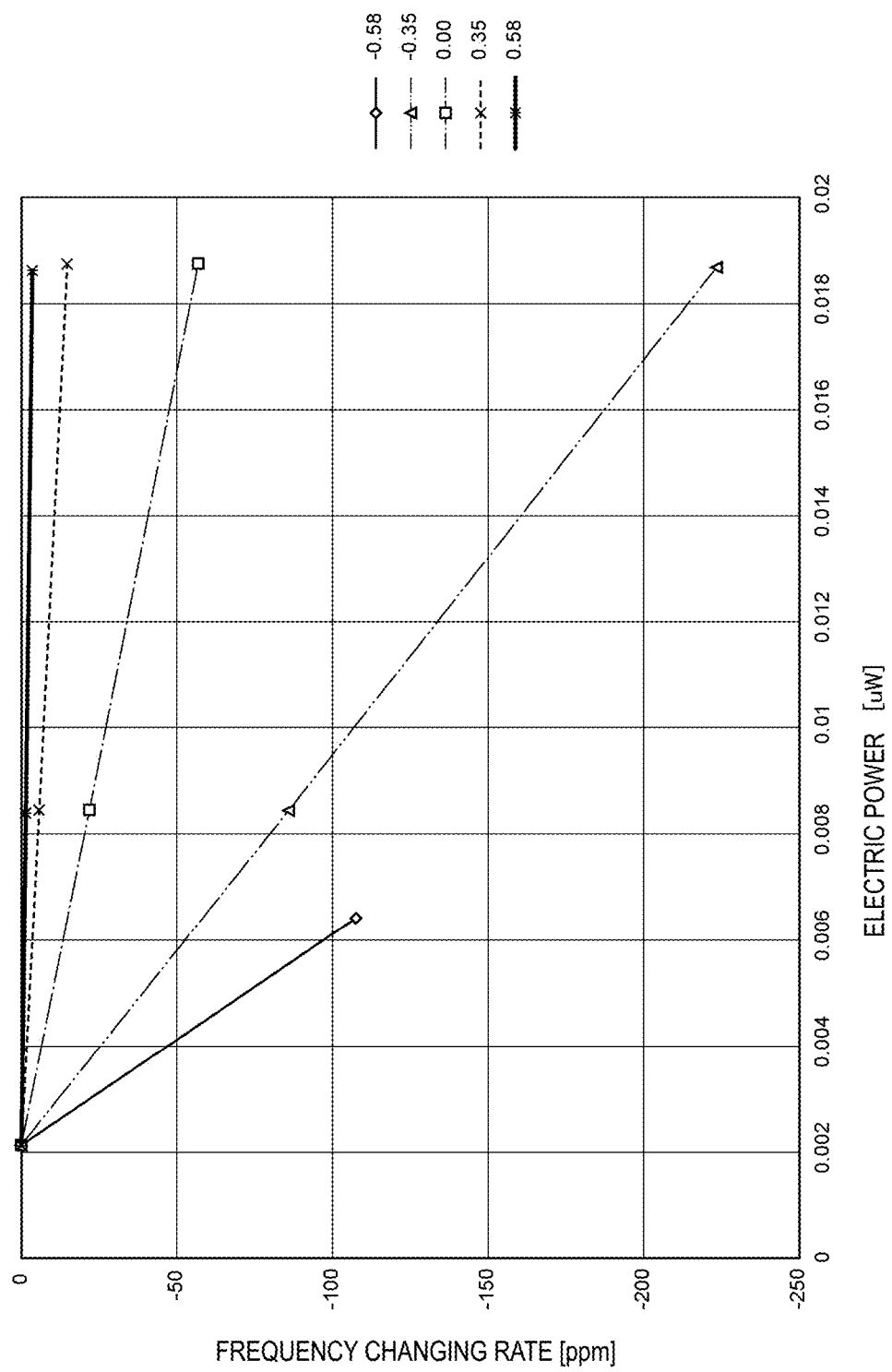
FIG. 12 is a graph illustrating relation between power and frequency changing rates for each of connection positions on the base portion for a support arm illustrated in FIGS. 3, 9, and 10.
Figure 13:
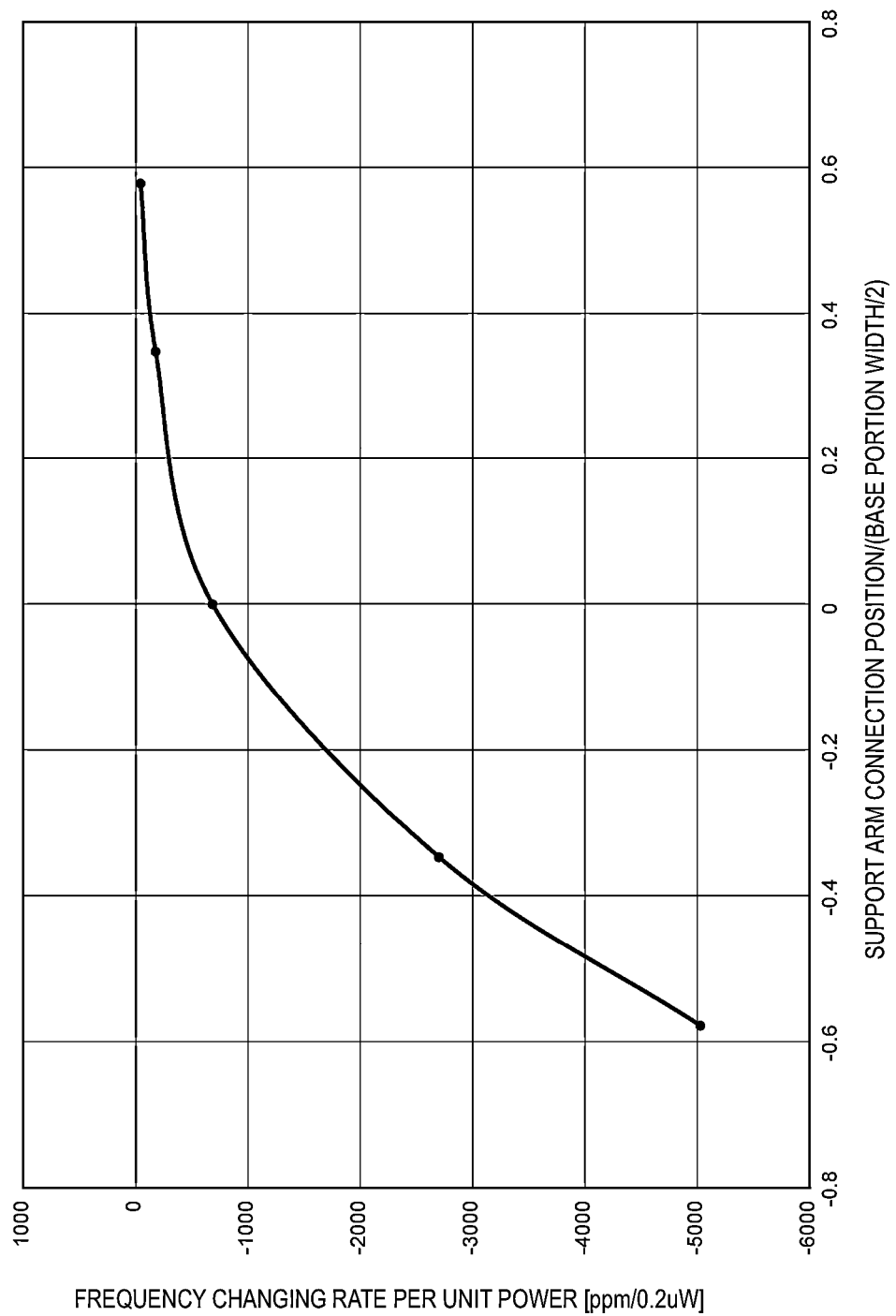
FIG. 13 is a graph illustrating relation between the connection positions on the base portion for the support arm illustrated in FIGS. 3, 9, and 10 and the frequency changing rates per unit power.

Subsequently, relation between the connection positions on the base portion for the support arm and DLD will be described with reference to FIGS. 12 and 13. FIG. 12 is a graph illustrating relation between power and frequency changing rates for each of connection positions on the base portion 130 for the support arm 151A illustrated in FIGS. 3, 9, and 10. FIG. 13 is a graph illustrating relation between the connection positions on the base portion 130 for the support arm 151A illustrated in FIGS. 3, 9, and 10 and the frequency changing rates per unit power. In FIG. 12, a horizontal axis represents electric power applied to the vibrating arms 121A to 121D and a vertical axis represents the frequency changing rate (df/f) in the resonant frequency (f). Further, lines in FIG. 12 are lines on conditions that values of distances to the connection positions of the support arm 151A divided by half of the base portion width are −0.58, −0.35, 0, 0.35, and 0.58, which distances are defined relative to the position of zero on the rear end portion 131B of the base portion 130 where the center line CL1 passes, with one side (right side) of the center line CL1 defined as positive and with the other side (left side) of the center line CL1 defined as negative. In FIG. 13, a horizontal axis represents the values of the distances to the connection positions of the support arm 151A divided by half of the base portion width, which distances are defined relative to the position of zero on the rear end portion 131B of the base portion 130 where the center line CL1 passes, with one side (right side) of the center line CL1 defined as positive and with the other side (left side) of the center line CL1 defined as negative.

Meanwhile, a vertical axis represents the frequency changing rate (df/f) in the resonant frequency (f) per unit power (0.2 μW), which is the index of DLD.

As illustrated in FIG. 12, it is observed that the frequency changing rates change in the negative direction for all the connection positions. Further, it is observed that a slope of the frequency changing rate in the negative direction tends to be greater in case where the other end of the support arm 151A is connected to a negative position, that is, a position on the other side with respect to the center line CL1, on the rear end portion 131B of the base portion 130.

As illustrated in FIG. 13, meanwhile, it is observed that the values of the frequency changing rate per unit power are negative for all the connection positions and that absolute values of the frequency changing rate per unit power are greater in case where the other end of the support arm 151A is connected to a position on the other side with respect to the center line CL1.

Thus, the other end of the support arm 151A is connected to a position on the rear end portion 131B of the base portion 130 that is deviated from the center line CL1 and is accordingly connected to the position on the rear end portion 131B of the base portion 130 that is asymmetric with respect to the center line CL1, so that the flexure of the base portion 130 can be increased.

Further, the support arm 151A extends from one side to the other side with respect to the center line CL1 and the other end of the support arm 151A is connected to a position on the other side on the rear end portion 131B of the base portion 130, so that the flexure of the base portion 130 can be further increased.

Incidentally, the other end of the support arm 151A is not limited to the same connected to the rear end portion 131B of the base portion 130. The other end of the support arm 151A may be connected to a side portion of the base portion 130, for example, as long as the support arm 151A is asymmetric with respect to the center line CL1 in plan view.

Figure 14:
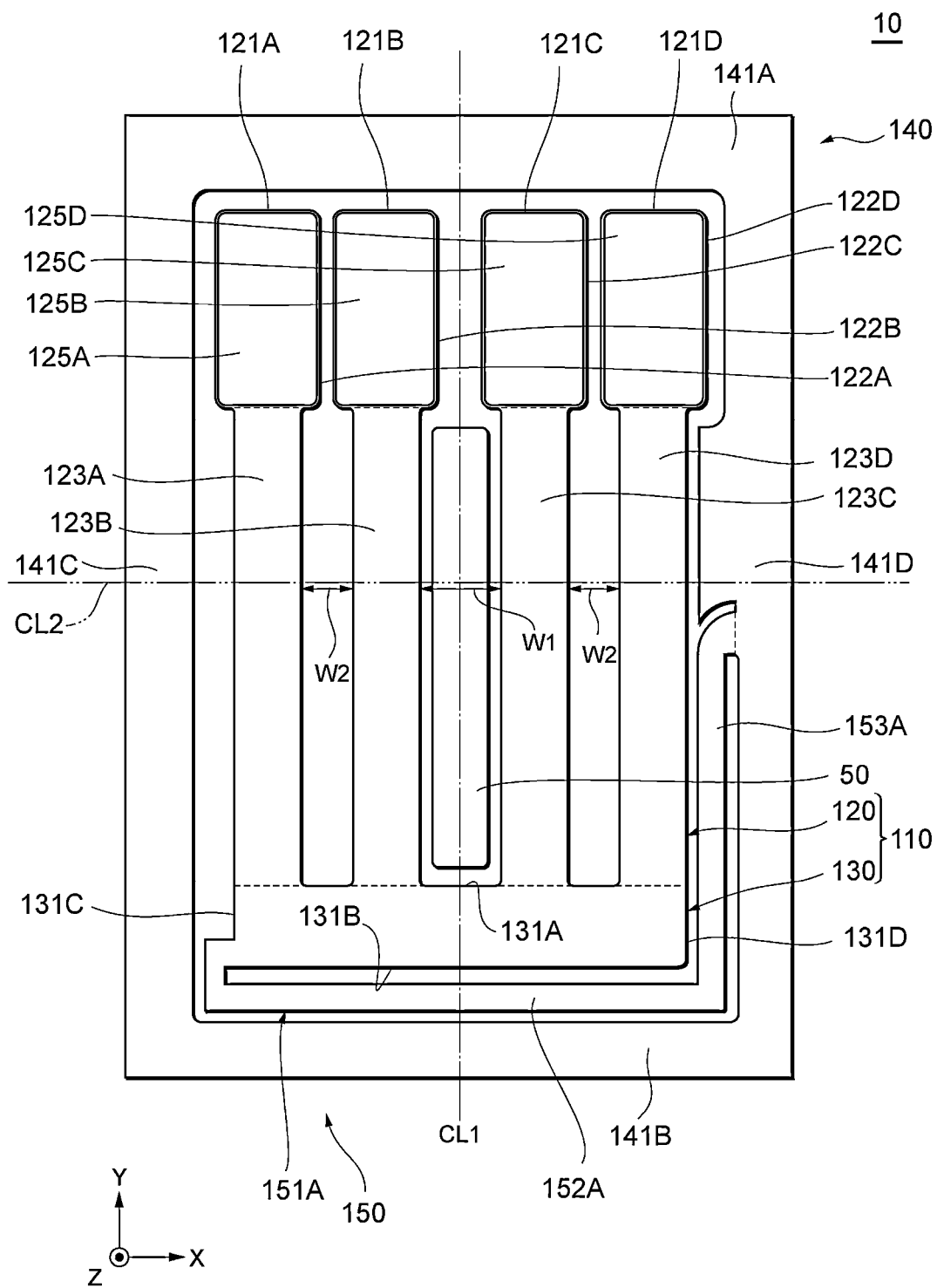
FIG. 14 is a plan view generally illustrating a structure of a resonator in a third modification in accordance with aspects of the present disclosure.

Subsequently, still another modification of the resonator according to one aspect of the disclosure will be described with reference to FIG. 14. FIG. 14 is a plan view generally illustrating a structure of the resonator 10 in a third modification of one aspect of the disclosure.

In the resonator 10 of the third modification, as illustrated in FIG. 14, the support arm 151A is connected to the left end portion 131C of the base portion 130. More particularly, the support arm 151A extends from one side (positive side in X axis direction or side of the right end portion 131D) to the other side (negative side in X axis direction or side of the left end portion 131C) with respect to the center line CL1. Further, the support arm 151A is bent to the positive side in X axis direction between the frame body 141C and the vibrating arm 121A and is further bent to the positive side in Y axis direction and the other end of the support arm 151A is connected to the left end portion 131C of the base portion 130.

By extension of the support arm 151A from the one side to the other side with respect to the center line CL1 of the vibrating portion 110 with respect to the longitudinal direction in plan view and connection of the other end of the support arm 151A to the left end portion 131C on the other side in the base portion 130, in this manner, the flexure of the base portion 130 is increased compared with the conventional configuration being symmetrical or substantially symmetrical with respect to the center line of the vibrating portion with respect to the longitudinal direction, so that the frequency changing rate in the resonant frequency per unit power can be changed in the negative direction. Accordingly, the frequency changing rate in the resonant frequency per unit power can be lowered and DLD can be further improved.

Figure 15:
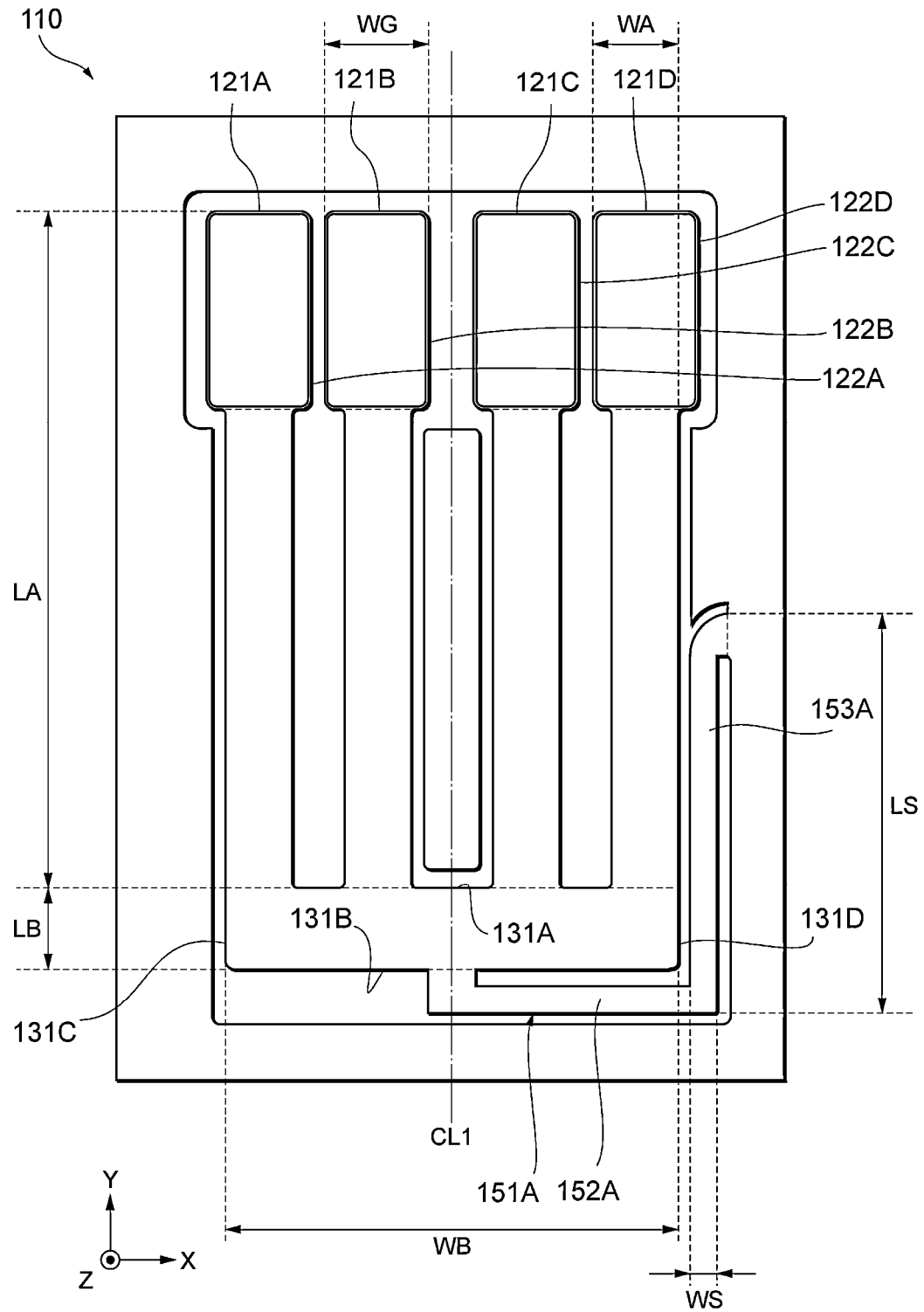
FIG. 15 is a plan view for description of sizes of the vibrating portion illustrated in FIG. 3.

Subsequently, sizes of the vibrating portion in plan view will be described with reference to FIG. 15. FIG. 15 is a plan view for description of the sizes of the vibrating portion 110 illustrated in FIG. 3.

In the vibrating portion 110 of the resonator 10 of one aspect of the disclosure, as illustrated in FIG. 15, a width WG of each of the mass addition portions 122A to 122D along X axis direction is 49 μm, for example. Meanwhile, a vibrating arm width WA of each of the vibrating arms 121A to 121D along X axis direction is 26 μm, for example, and a vibrating arm length LA of each of the vibrating arms 121A to 121D along Y axis is 415 μm, for example.

Additionally, a distance of the base portion 130 in a length direction that is a direction from the fore end portion 131A toward the rear end portion 131B, that is, a length of a base portion width WB is 18 μm, for example. Meanwhile, a distance thereof in a width direction that is a direction from the left end portion 131C toward the right end portion 131D, that is, a length of a base portion length LB is 20 μm, for example.

Herein, in accordance with aspects of the present disclosure, the frequency changing rate in the resonant frequency per unit power can be lowered in case where a ratio of the length of the base portion length LB to the length of the base portion width WB is smaller than or equal to a specified multiple. More particularly, it is found that the length of the base portion length LB is preferably 0.3 or less times the length of the base portion width WB. Thus, the frequency changing rate in the resonant frequency per unit power can be effectively lowered.

In the miniaturized resonator 10, specifically, the length of the base portion length LB is 90 μm or less and the length of the base portion width WB is 300 μm or less. Thus, the frequency changing rate in the resonant frequency per unit power can be effectively lowered even in the miniaturized resonator 10 whose sizes are restricted.

Meanwhile, a length of a support arm width WS of the support arm 151A along X axis direction is 25 μm for example, and a length of a support arm length LS of the support arm 151A along Y axis direction is 225 μm, for example.

Though the example in which the vibrating portion 110 of the resonator 10 includes the four vibrating arms 121A to 121D is used in one aspect of the disclosure, there is no limitation thereto. The vibrating portion 110 may include three or five or more vibrating arms, for example. In this case, at least two vibrating arms bend out of plane with different phases.

Subsequently, a resonator and a resonance device according to one aspect of the disclosure of the present invention will be described with reference to FIGS. 16 to 21. As for aspects below, incidentally, configurations that are the same as or similar to those of aspects of the disclosure are provided with the same or similar reference characters and differences from aspects of the disclosure will be described. Further, similar function effects resulting from similar configurations will not be referred to one by one.

Figure 16:
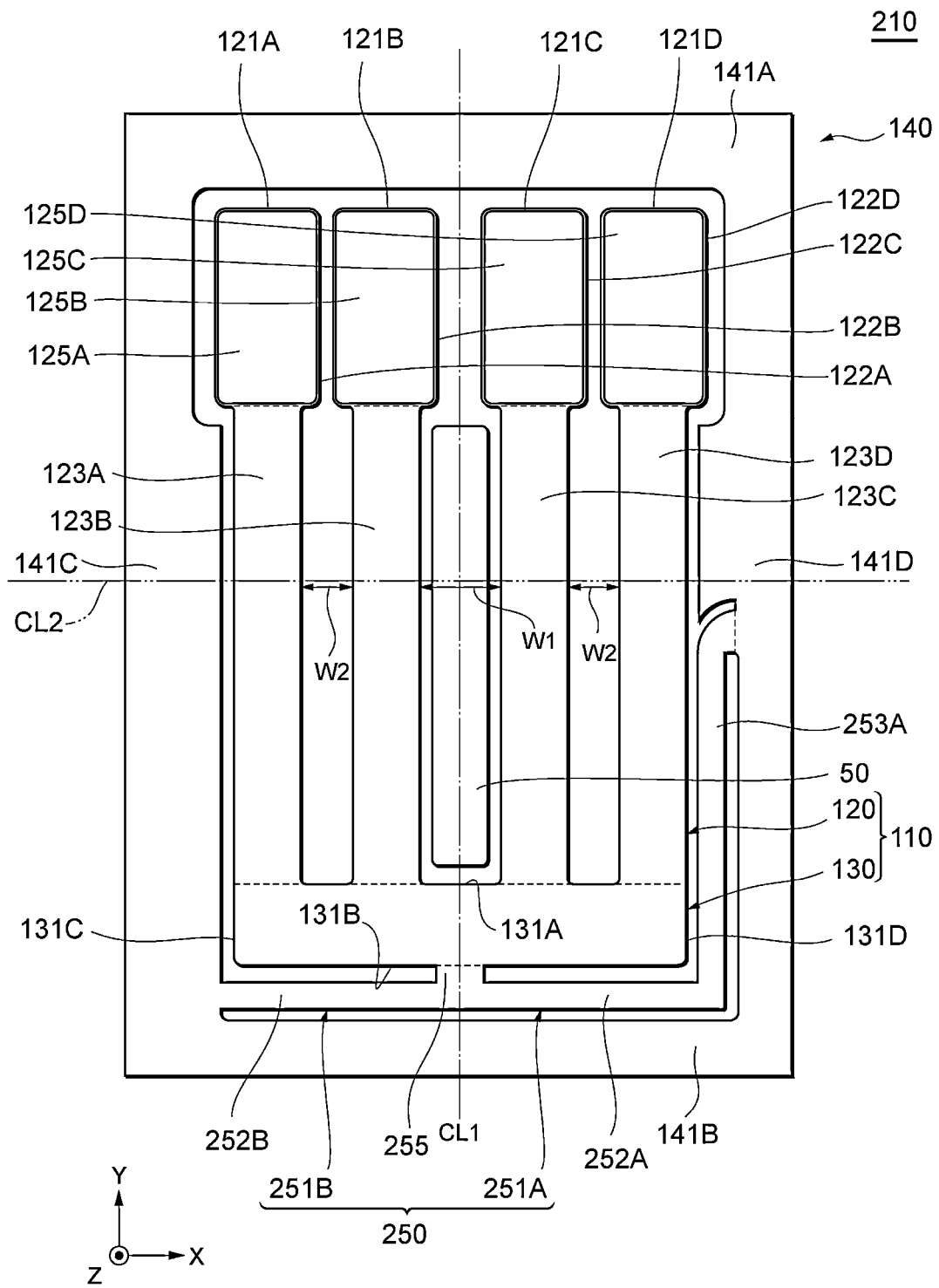
FIG. 16 is a plan view generally illustrating a structure of a resonator in accordance with aspects of the present disclosure.

Initially, a general configuration of the resonator according to one aspect of the disclosure will be described with reference to FIG. 16. FIG. 16 is a plan view generally illustrating a structure of a resonator 210 in one aspect of the disclosure. Incidentally, FIG. 16 is the plan view corresponding to FIG. 3 in one aspect of the disclosure.

The resonator 210 of one aspect of the disclosure differs from the support arm portion 150 of the resonator 10 of aspects of the disclosure in that a support arm portion 250 includes two support arms 251A and 251B.

In the resonator 210, as illustrated in FIG. 16, the support arm portion 250 includes the support arm 251A and the support arm 251B. Additionally, the support arm portion 250 further includes a connection arm 255.

The support arm 251A and the support arm 251B are formed so as to be asymmetric with respect to the center line CL1 in plan view. Specifically, the support arm 251A includes a support rear arm 252A and a support side arm 253A, while the support arm 251B includes a support rear arm 252B.

The support side arm 253A extends in parallel with the vibrating arm 121D between the vibrating arm 121D and the holding portion 140. Specifically, the support side arm 253A extends in Y axis direction from one end (right end or end on the side of the frame body 141D) of the support rear arm 252A toward the frame body 141A, is bent in X axis direction, and is connected to the frame body 141D.

The support rear arm 252A extends from the support side arm 253A between the rear end portion 131B of the base portion 130 and the holding portion 140. Meanwhile, the support rear arm 252B extends from the holding portion 140 between the rear end portion 131B of the base portion 130 and the holding portion 140. Specifically, the support rear arm 252A extends in X axis direction from one end (lower end or end on the side of the frame body 141B) of the support side arm 253A toward the frame body 141C. Meanwhile, the support rear arm 252B has one end (left end or end on the side of the frame body 141C) connected to the frame body 141C and extends in Y axis direction toward the frame body 141D. That is, one end of each of the support arm 251A and the support arm 251B is connected to the holding portion 140.

Further, the support rear arms 252A and 252B are linked to each other between the rear end portion 131B of the base portion 130 and the holding portion 140. Specifically, the other end (left end) of the support rear arm 252A and the other end (right end) of the support rear arm 252B are linked to each other at a center between the support rear arm 252A and the support rear arm 252B along X axis direction.

The connection arm 255 makes a connection between the other end of each of the linked two support arms 251A and 251B and the rear end portion 131B of the base portion 130. The connection arm 255 is connected to one place at a position on the rear end portion 131B of the base portion 130 where the center line CL1 passes.

Thus, the one support arm 251A and the other support arm 251B of the two support arms 251A and 251B increase the flexure of the base portion 130 because being asymmetric with respect to the center line CL1 in plan view, compared with the conventional configuration being symmetrical or substantially symmetrical with respect to the center line of the vibrating portion with respect to the longitudinal direction, so that DLD can be further improved even for the resonator 210 including the two support arms 251A and 251B.

Though the example in which the support arm 251A and the support arm 251B are connected through the connection arm 255 to the center position on the rear end portion 131B of the base portion 130 in the resonator 210 illustrated in FIG. 16 has been disclosed in one aspect of the disclosure, there is no limitation to this example. The support arm 251A and the support arm 251B may be connected to another position on the rear end portion 131B of the base portion 130 as long as the support arm 251A and the support arm 251B are asymmetric with respect to the center line CL1 in plan view.

Figure 17:
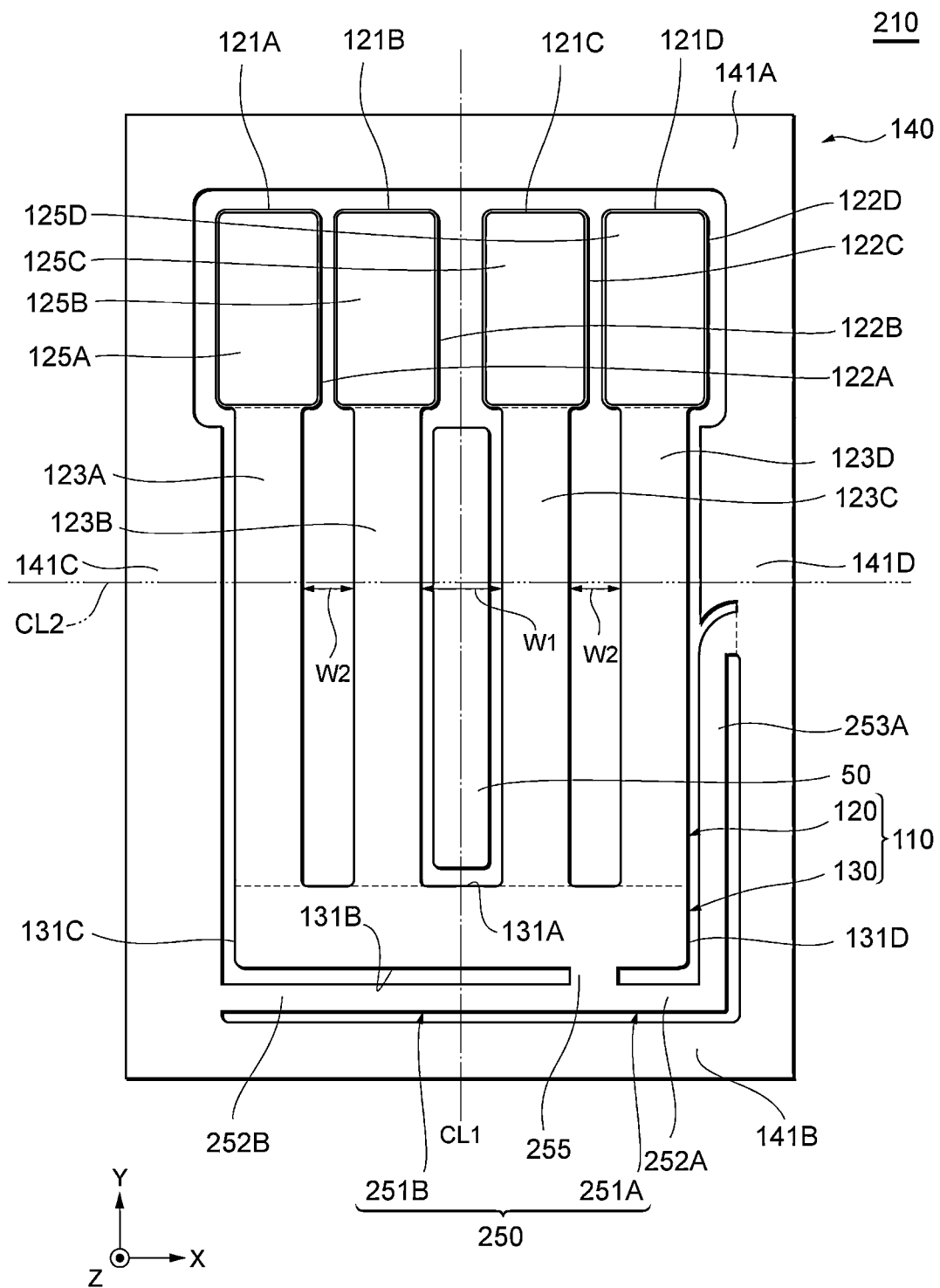
FIG. 17 is a plan view generally illustrating a structure of a resonator in a first modification in accordance with aspects of the present disclosure.
Figure 18:
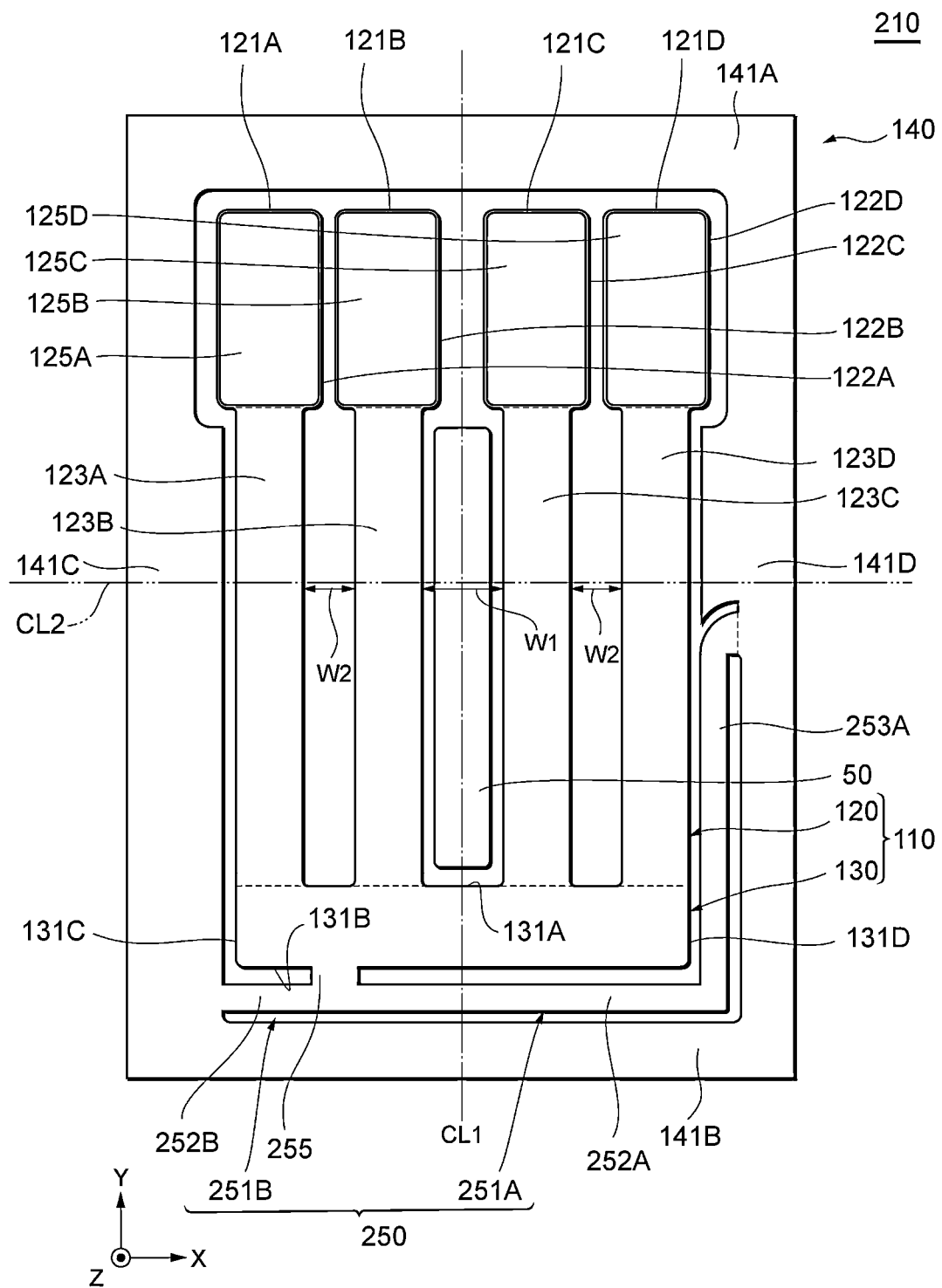
FIG. 18 is a plan view generally illustrating a structure of a resonator in a second modification in accordance with aspects of the present disclosure.

Subsequently, modifications of the resonator according to aspects of the disclosure will be described with reference to FIGS. 17 and 18. FIG. 17 is a plan view generally illustrating a structure of the resonator 210 in a first modification of aspects of the disclosure. FIG. 18 is a plan view generally illustrating a structure of the resonator 210 in a second modification aspects of the disclosure.

In the resonator 210 of the first modification, as illustrated in FIG. 17, the support arm 251A and the support arm 251B are connected to a position on the rear end portion 131B of the base portion 130 that is deviated from the center line CL1. Specifically, the other end of the support rear arm 252A and the other end of the support rear arm 252B are linked to each other on one side (positive side in X axis direction or side of the right end portion 131D) with respect to the center line CL1. Further, the connection arm 255 that makes a connection between the other end of each of the linked two support arms 251A and 251B and the rear end portion 131B of the base portion 130 is connected to one side on the rear end portion 131B of the base portion 130 with respect to the center line CL1.

In the resonator 210 of the second modification as illustrated in FIG. 18, meanwhile, the support arm 251A and the support arm 251B are connected to a position on the rear end portion 131B of the base portion 130 that is deviated from the center line CL1. Specifically, the other end of the support rear arm 252A and the other end of the support rear arm 252B are linked to each other on the other side (negative side in X axis direction or side of the left end portion 131C) with respect to the center line CL1. Further, the connection arm 255 that makes a connection between the other end of each of the linked two support arms 251A and 251B and the rear end portion 131B of the base portion 130 is connected to the other side on the rear end portion 131B of the base portion 130 with respect to the center line CL1.

Figure 19:
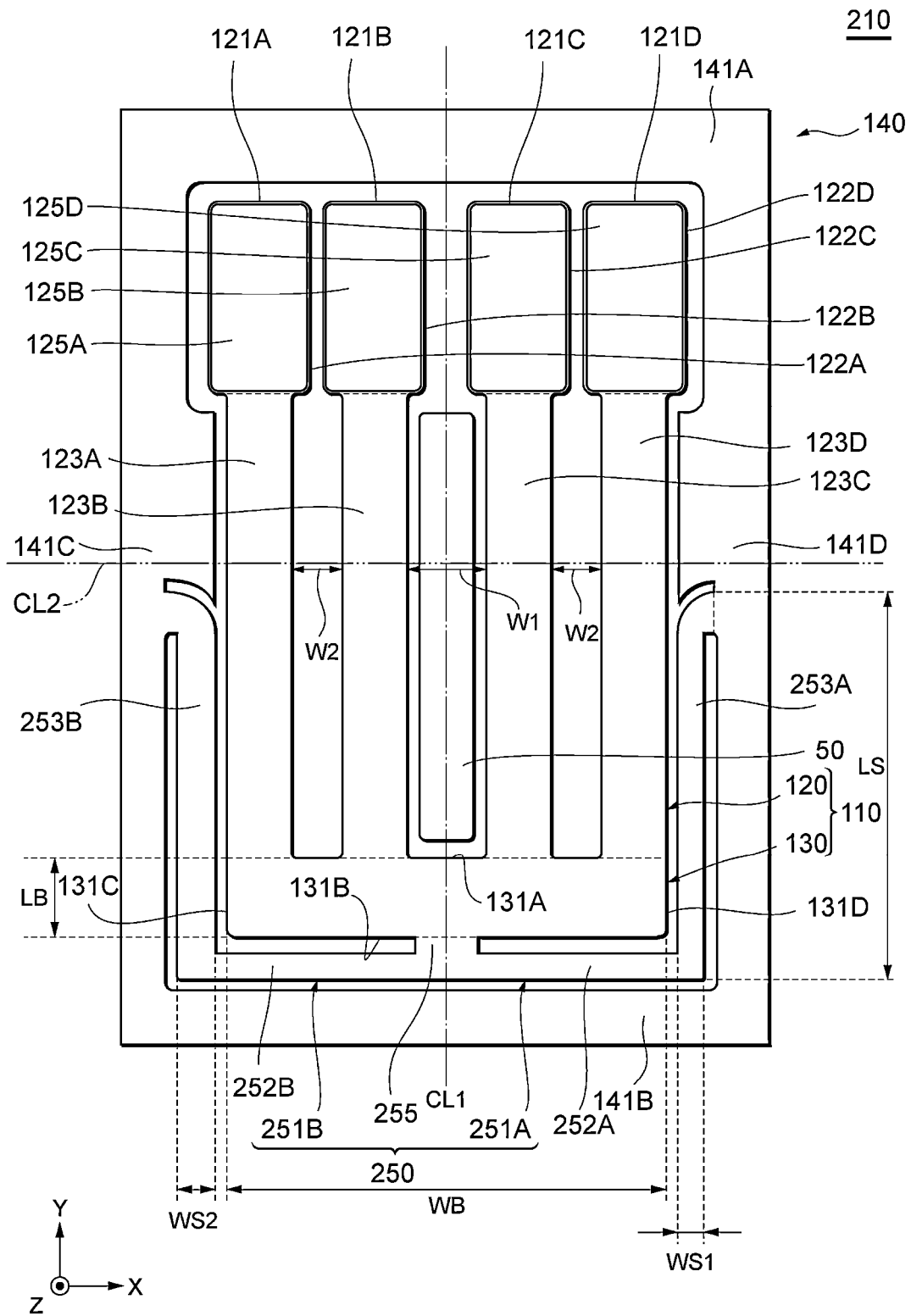
FIG. 19 is a plan view generally illustrating a structure of a resonator in a third modification in accordance with aspects of the present disclosure.
Figure 20:
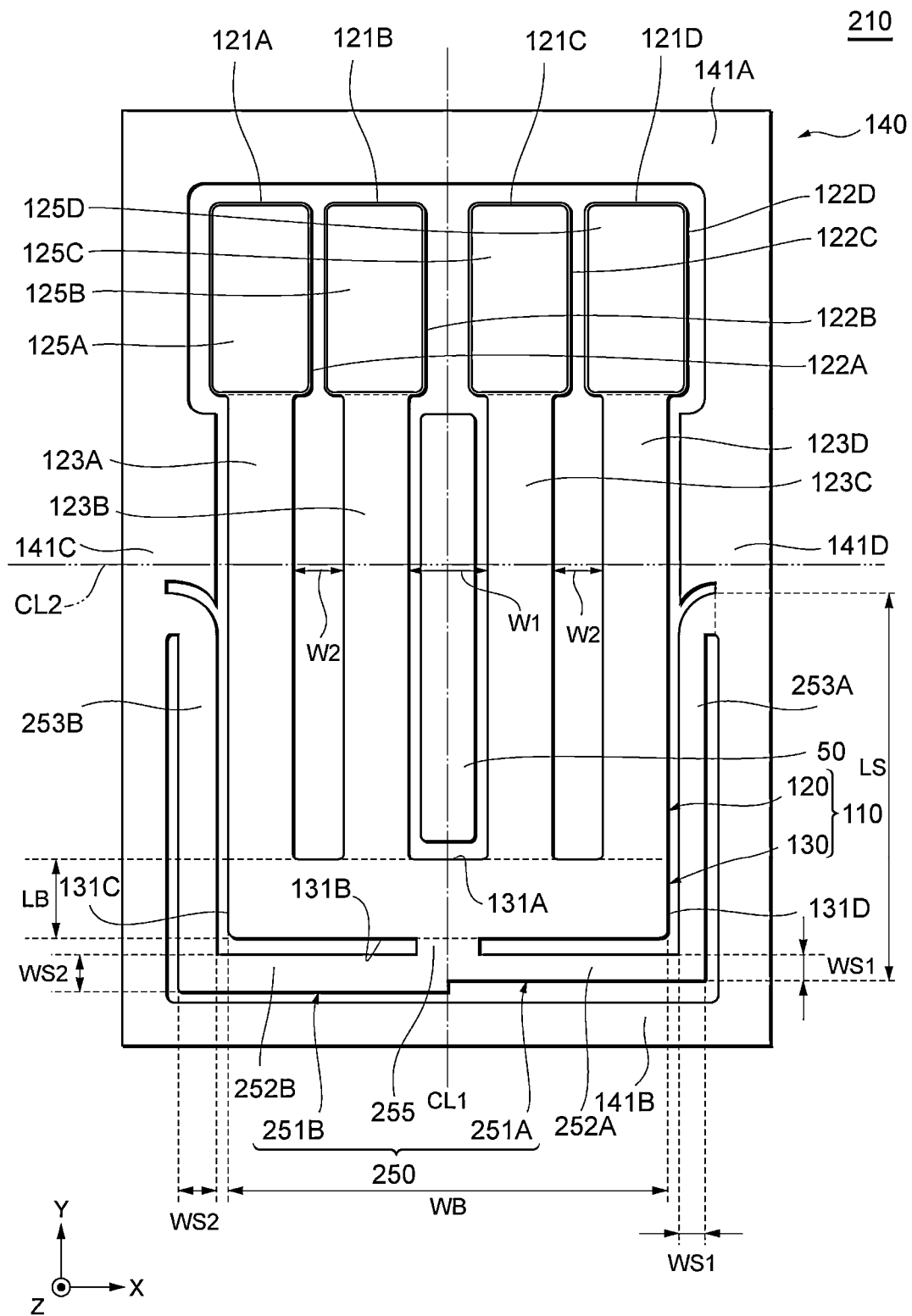
FIG. 20 is a plan view generally illustrating a structure of a resonator in a fourth modification in accordance with aspects of the present disclosure.
Figure 21:
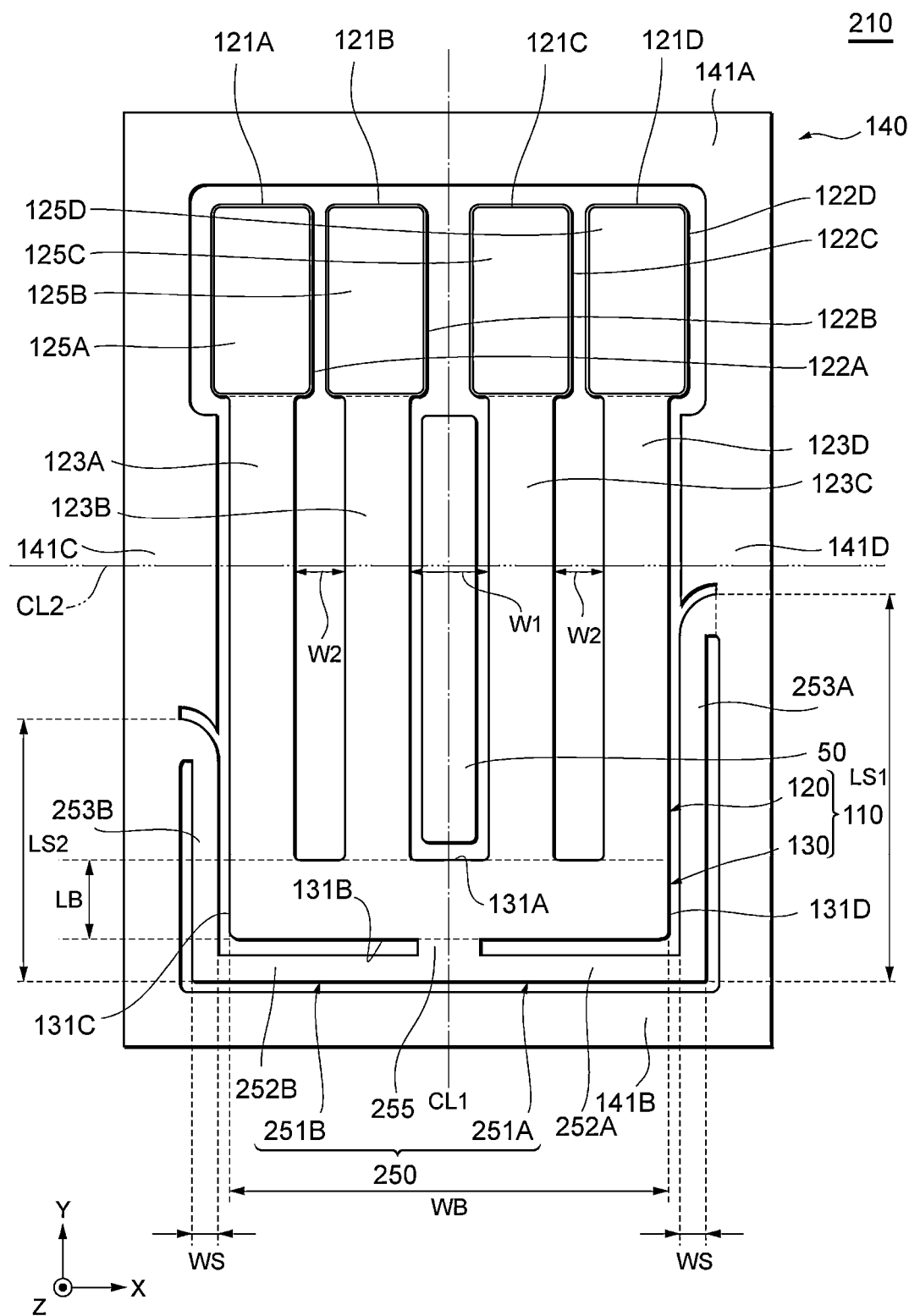
FIG. 21 is a plan view generally illustrating a structure of a resonator in a fifth modification in accordance with aspects of the present disclosure.

Subsequently, still another modification of the resonator according to one aspect of the disclosure will be described with reference to FIGS. 19 to 21. FIG. 19 is a plan view generally illustrating a structure of the resonator 210 in a third modification of aspects of the disclosure. FIG. 20 is a plan view generally illustrating a structure of the resonator 210 in a fourth modification of aspects of the disclosure. FIG. 21 is a plan view generally illustrating a structure of the resonator 210 in a fifth modification of aspects of the disclosure.

In the resonator 210 of the third modification and the fourth modification, as illustrated in FIGS. 19 and 20, the support arm 251B includes a support side arm 253B in addition to the support rear arm 252B.

The support side arm 253B extends in parallel with the vibrating arm 121A between the vibrating arm 121A and the holding portion 140. Specifically, the support side arm 253B extends in Y axis direction from one end (left end or end on the side of the frame body 141C) of the support rear arm 252B toward the frame body 141A, is bent in X axis direction, and is connected to the frame body 141C.

Further, in the resonator 210 of the third modification and the fourth modification, the support arm 251A and the support arm 251B differ in lengths of support arm widths WS1 and WS2.

As illustrated in FIG. 19, specifically, the length of the support arm width WS1 of the support side arm 253A along X axis direction is smaller than the length of the support arm width WS2 of the support side arm 253B along X axis direction (length of support arm width WS1 <length of support arm width WS2).

As illustrated in FIG. 20, meanwhile, a length of the support arm width WS1 of the support rear arm 252A along Y axis direction and the length of the support arm width WS1 of the support side arm 253A along X axis direction are smaller than a length of the support arm width WS2 of the support rear arm 252B along Y axis direction and the length of the support arm width WS2 of the support side arm 253B along X axis direction (length of support arm width WS1 <length of support arm width WS2).

Thus, the one support arm 251A and the other support arm 251B of the two support arms 251A and 251B differ in the lengths of the support arm widths WS1 and WS2 so that the two support arms 251A and 251B can be easily made asymmetric with respect to the center line CL1.

In the resonator 210 of the fifth modification, on the other hand, the support arm 251A and the support arm 251B differ in lengths of support arm lengths LS1 and LS2.

As illustrated in FIG. 21, specifically, the length of the support arm length LS1 of the support side arm 253A along Y axis direction is larger than the length of the support arm length LS2 of the support side arm 253B along Y axis direction (length of support arm length LS1 >length of support arm length LS2).

Thus, the one support arm 251A and the other support arm 251B of the two support arms 251A and 251B differ in the lengths of the support arm lengths LS1 and LS2 so that the two support arms 251A and 251B can be easily made asymmetric with respect to the center line CL1.

Aspect of the disclosure have been described above. In the resonator according to one aspect of the disclosure, the support arm is asymmetric with respect to the center line of the vibrating portion with respect to the longitudinal direction in plan view. Thus, the flexure of the base portion is increased, compared with the conventional configuration being symmetrical or substantially symmetrical with respect to the center line of the vibrating portion with respect to the longitudinal direction, so that the frequency changing rate in the resonant frequency per unit power that is the index of DLD and can be changed in the negative direction. Accordingly, the frequency changing rate in the resonant frequency per unit power can be lowered and DLD can be further improved.

Further, in the resonator described above, the other end of the support arm is connected to the position on the rear end portion of the base portion that is deviated from the center line. Thus, the other end of the support arm is connected to the position on the rear end portion of the base portion that is asymmetric with respect to the center line, so that the flexure of the base portion can be increased.

Further, in the resonator described above, the support arm extends from the one side to the other side with respect to the center line and the other end of the support arm is connected to the position on the other side on the rear end portion of the base portion. Thus, the flexure of the base portion can be further increased.

Further, in the resonator described above, the one support arm and the other support arm of the two support arms are asymmetric with respect to the center line in plan view. Thus, the flexure of the base portion is increased, compared with the conventional configuration being symmetrical or substantially symmetrical with respect to the center line of the vibrating portion with respect to the longitudinal direction, so that DLD can be further improved even for the resonator including the two support arms.

Further, in the resonator described above, the one support arm and the other support arm of the two support arms differ in lengths of support arm widths. Thus, the two support arms can be easily made asymmetric with respect to the center line.

Further, in the resonator described above, the one support arm and the other support arm of the two support arms differ in the lengths of the support arm lengths so that the two support arms can be easily made asymmetric with respect to the center line.

Further, in the resonator described above, the length of the base portion length is 0.3 or less times the length of the base portion width. Herein, in accordance with one aspect of the disclosure that the frequency changing rate in the resonant frequency per unit power can be lowered in case where the ratio of the length of the base portion length to the length of the base portion width is smaller than or equal to the specified multiple, more particularly, 0.3 or less. Thus, the frequency changing rate in the resonant frequency per unit power can be effectively lowered.

Further, in the resonator described above, the length of the base portion length is 90 μm or less and the length of the base portion width is 300 μm or less. Thus, the frequency changing rate in the resonant frequency per unit power can be effectively lowered even in the miniaturized resonator whose sizes are restricted.

Further, in the resonator according to one aspect of the disclosure, by the extension of the support arm from the one side to the other side with respect to the center line of the vibrating portion with respect to the longitudinal direction in plan view and the connection of the other end of the support arm to the left end portion on the other side in the base portion, the flexure of the base portion is increased, compared with the conventional configuration being symmetrical or substantially symmetrical with respect to the center line of the vibrating portion with respect to the longitudinal direction, so that the frequency changing rate in the resonant frequency per unit power can be changed in the negative direction. Accordingly, the frequency changing rate in the resonant frequency per unit power can be lowered and DLD can be further improved.

Further, the resonance device according to one aspect of the disclosure includes the resonator described above. Thus, the resonance device by which DLD is further improved can be implemented.

Further, the resonance device described above further includes the lower lid and the upper lid. Thus, the vibration space for the vibrating portion that bends out of plane can be easily formed.

Incidentally, the aspects described above are intended for facilitating understanding of the present disclosure and are not intended for limitedly interpreting the disclosure. Modifications/improvements of the disclosure may be made without departing from the purport thereof and equivalents of the disclosure are also included in the disclosure. That is, the aspects and/or modifications changed appropriately in design by those skilled in the art are encompassed by the scope of the disclosure, as long as features of the disclosure are provided therein. For example, elements provided in the aspects and/or modifications and placement, material, condition, shape, size, and the like thereof are not limited to those exemplified and can be appropriately changed. Additionally, the aspects and/or modifications are exemplary, it goes without saying that partial substitution or combination of configurations disclosed in different aspects and/or modifications can be made, and these are also encompassed by the scope of the disclosure as long as features of the disclosure are included therein.

DESCRIPTION OF REFERENCE SYMBOLS 1 resonance device
10 resonator
20 lower lid
21 recessed portion
22 bottom plate
23 side wall
30 upper lid
31 recessed portion
32 bottom plate
33 side wall
40 joint portion
50 protruding portion
110 vibrating portion
120 excitation portion
121, 121A, 121B, 121C, 121D vibrating arm
122A, 122B, 122C, 122D mass addition portion
123A, 123B, 123C, 123D arm portion
125A, 125B, 125C, 125D mass addition film
130 base portion
131A fore end portion
131B rear end portion
131C left end portion
131D right end portion
140 holding portion
141A, 141B, 141C, 141D frame body
150 support arm portion
151A support arm
152A support rear arm
153A support side arm
210 resonator
250 support arm portion
251A, 251B support arm
252A, 252B support rear arm
253A, 253B support side arm
255 connection arm
CL1 center line
LA vibrating arm length
LB base portion length
LS, LS1, LS2 support arm length
r1, r2 center axis
WA vibrating arm width
WB base portion width
WG width
WS, WS1, WS2 support arm width

The invention claimed is:

1. A resonator comprising:
a vibrating portion including:
  a plurality of vibrating arms each having a fixed end, wherein at least two vibrating arms of the plurality of vibrating arms are configured to bend out of plane with different phases, and
  a base portion comprising a first end attached to each fixed end of the plurality of vibrating arms and a second end opposed to the first end;
a holding portion configured to hold the vibrating portion; and
a support arm comprising a first end connected to the holding portion and a second end connected to the second end of the base portion,
wherein the support arm consists of a single arm that is asymmetric with respect to a center line of the vibrating portion with respect to a longitudinal direction in a plan view.

2. The resonator according to claim 1, wherein the second end of the support arm is connected to a position on the second end of the base portion that is deviated from the center line of the vibrating portion.

3. The resonator according to claim 1, wherein:
the support arm extends from a first side to a second side with respect to the center line, and
the second end of the support arm is connected to a position on the second side on the second end of the base portion.

4. The resonator according to claim 3, further comprising:
a second support arm, and
wherein the support arm on the first side and the second support arm on the second side are asymmetric with respect to the center line in the plan view.

5. The resonator according to claim 4, wherein the support arm on the first side and the second support arm on the second side of differ in lengths of a width of the support arm and the second support arm.

6. The resonator according to claim 4, wherein the support arm on the first side and the second support arm on the second side differ in lengths.

7. The resonator according to claim 1, wherein a length of the base portion is a direction from the first end toward the second end, and a width of the base portion is a direction orthogonal to the length, and wherein the length of the base portion is less than or equal to 0.3 times the width of the base portion.

8. The resonator according to claim 7, wherein the length of the base portion is less than or equal to 90 μm and the width of the base portion less than or equal to 300 μm.

9. A resonator comprising:
a vibrating portion including:
  three vibrating arms each having a fixed end, wherein at least two vibrating arms of the three vibrating arms are configured to bend out of plane with different phases, and
  a base portion having a first end coupled to the fixed end of each of the three vibrating arms, a second end opposed to the first end, and a side end;
a holding portion configured to hold the vibrating portion; and
a support arm comprising a first end connected to the holding portion and a second end connected to the side end of the base portion,
wherein the support arm extends from a first side to a second side with respect to a center line of the vibrating portion with respect to a longitudinal direction in a plan view, and the second end of the support arm is connected to the side end on the second side on the base portion.

10. A resonance device comprising:
a resonator including:
a vibrating portion including:
  a plurality of vibrating arms each having a fixed end, wherein at least two vibrating arms of the plurality of vibrating arms are configured to bend out of plane with different phases, and
  a base portion comprising a first end coupled to each fixed end of the plurality of vibrating arms and a second end opposed to the first end;
a holding portion configured to hold the vibrating portion; and a support arm comprising a first end connected to the holding portion and a second end connected to the second end of the base portion,
wherein the support arm consists of a single arm that is asymmetric with respect to a center line of the vibrating portion with respect to a longitudinal direction in a plan view.

11. The resonance device according to claim 10, wherein the second end of the support arm is connected to a position on the second end of the base portion that deviates from the center line of the vibrating portion.

12. The resonance device according to claim 10, wherein:
the support arm extends from a first side to a second side with respect to the center line, and
the second end of the support arm is connected to a position on the second side on the second end of the base portion.

13. The resonance device according to claim 12, further comprising a second support arm, with the support arm on the first side and the second support arm on the second side being asymmetric with respect to the center line in the plan view.

14. The resonance device according to claim 13, wherein the support arm on the first side and the second support arm on the second side differ in lengths of a width of the support arm and the second support arm.

15. The resonance device according to claim 13, wherein the support arm on the first side and the second support arm on the second side differ in lengths.

16. The resonance device according to claim 10, wherein a length of the base portion is a direction from the first end toward the second end, and a width of the base portion is a direction orthogonal to the length, and wherein the length of the base portion is less than or equal to 0.3 times the width of the base portion.

17. The resonance device according to claim 16, wherein the length of the base portion is less than or equal to 90 μm and the width of the base portion less than or equal to 300 μm.

18. The resonance device according to claim 10, further comprising a lid body.

19. The resonance device according to claim 18, wherein the lid body includes a lower lid and an upper lid.

20. The resonance device according to claim 19, wherein the lower lid is below the resonator, and the upper lid is above the resonator.

* * * * *